(12) United States Patent
Kim et al.

(10) Patent No.: US 12,532,587 B2
(45) Date of Patent: Jan. 20, 2026

(54) DISPLAY DEVICE AND METHOD OF MANUFACTURING THE SAME

(71) Applicant: Samsung Display Co., LTD., Yongin-si (KR)

(72) Inventors: Yeon Kyung Kim, Seoul (KR); Jin Seon Kwak, Hwaseong-si (KR); Dong Woo Kim, Yongin-si (KR); Do Yeong Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 420 days.

(21) Appl. No.: 18/057,705

(22) Filed: Nov. 21, 2022

(65) Prior Publication Data

US 2023/0317901 A1 Oct. 5, 2023

(30) Foreign Application Priority Data

Apr. 1, 2022 (KR) .................. 10-2022-0041110

(51) Int. Cl.
*H10H 20/857* (2025.01)
*H10H 20/01* (2025.01)
*H10H 20/831* (2025.01)

(52) U.S. Cl.
CPC .......... *H10H 20/857* (2025.01); *H10H 20/01* (2025.01); *H10H 20/8316* (2025.01); *H10H 20/032* (2025.01); *H10H 20/0364* (2025.01)

(58) Field of Classification Search
CPC .. H10H 20/857; H10H 20/01; H10H 20/8316; H10H 20/032; H10H 20/0364; H10H 20/83; H01L 25/0753; H01L 25/167; G09G 3/006; G09G 3/32; G09G 2300/0426; H10D 86/441; H10D 86/451
See application file for complete search history.

(56) References Cited

U.S. PATENT DOCUMENTS

| 10,991,301 | B2 * | 4/2021 | Lee ................ G09G 3/006 |
| 11,495,655 | B2 | 11/2022 | Lee et al. |
| 12,074,172 | B2 * | 8/2024 | Shin ................ H10D 86/60 |
| 2006/0061524 | A1 * | 3/2006 | Suh ................ G09G 3/3216 345/76 |
| 2006/0103410 | A1 * | 5/2006 | Jeon ................ G09G 3/006 324/760.02 |

(Continued)

FOREIGN PATENT DOCUMENTS

| JP | 2016-224296 A | 12/2016 |
| KR | 10-2016-0082555 A | 7/2016 |

(Continued)

*Primary Examiner* — Victor A Mandala
(74) *Attorney, Agent, or Firm* — Womble Bond Dickinson (US) LLP

(57) ABSTRACT

A display device includes a display panel including a display area having a scan area, and having a power area on one side of the scan area, and a non-display area surrounding the display area, and having a pad portion on one side of the non-display area, the pad portion including a first pad including line pads connected to lines of the scan area, a second pad including line pads, and a power pad configured to supply an off signal to a line of the lines of the power area and connected to lines of the power area, and a panel-lighting-test line on at least one side of the power pad, and spaced apart from the power pad.

14 Claims, 17 Drawing Sheets

(56) References Cited

U.S. PATENT DOCUMENTS

| | | | | |
|---|---|---|---|---|
| 2015/0022211 A1* | 1/2015 | Du | ............... | G09G 3/006 |
| | | | | 324/414 |
| 2016/0321972 A1* | 11/2016 | Kang | ............... | G09G 3/3225 |
| 2017/0069239 A1* | 3/2017 | Kwon | ............... | G01R 31/44 |
| 2019/0285929 A1* | 9/2019 | Huang | ............... | G02F 1/13454 |
| 2021/0202675 A1* | 7/2021 | Jang | ............... | H10K 59/131 |
| 2021/0208433 A1* | 7/2021 | Ahn | ............... | G02F 1/1368 |
| 2021/0215985 A1* | 7/2021 | Shin | ............... | G02F 1/136263 |
| 2021/0318583 A1* | 10/2021 | Shin | ............... | G02F 1/136286 |
| 2022/0208945 A1* | 6/2022 | Lee | ............... | H10K 59/1315 |
| 2022/0208946 A1* | 6/2022 | Kim | ............... | H01L 25/167 |
| 2022/0208951 A1* | 6/2022 | Yoo | ............... | H10K 59/18 |
| 2022/0384490 A1* | 12/2022 | Hong | ............... | H10D 86/60 |
| 2023/0216005 A1* | 7/2023 | Paek | ............... | H10K 59/131 |
| 2023/0261008 A1* | 8/2023 | Shin | ............... | H10D 86/441 |
| | | | | 345/204 |
| 2023/0268469 A1 | 8/2023 | Lee et al. | | |

FOREIGN PATENT DOCUMENTS

| | | |
|---|---|---|
| KR | 10-2021-0089282 A | 7/2021 |
| KR | 10-2021-0089565 A | 7/2021 |
| KR | 10-2021-0103040 A | 8/2021 |
| KR | 2023-0127417 A | 9/2023 |

* cited by examiner

DISPLAY DEVICE AND METHOD OF MANUFACTURING THE SAME

CROSS-REFERENCE TO RELATED APPLICATION

This application claims priority to, and the benefit of, Korean Patent Application No. 10-2022-0041110 filed on Apr. 1, 2022, in the Korean Intellectual Property Office (KIPO), the entire contents of which being incorporated by reference herein.

BACKGROUND

Field

The present disclosure relates to a display device and to a method of manufacturing the same.

Description of the Related Art

With the advancement of the information age, the demand for a display device for displaying an image has increased with various forms. For example, the display device has been applied to various electronic devices, such as a smart phone, a digital camera, a laptop computer, a navigation device, and a smart television. The display device may be a flat panel display device, such as a liquid crystal display device, a field emission display device, and an organic light emitting display device. Among the flat panel display devices, the light emitting display device may include a light emitting element in which each of pixels of a display panel may self-emit light, thereby displaying an image without a backlight unit used to provide the display panel with light. The light emitting element may be an organic light emitting diode that uses an organic material as a fluorescent material and an inorganic light emitting diode that uses an inorganic material as a fluorescent material.

SUMMARY

Aspects of embodiments of the present disclosure provide a display device in which a panel-lighting-test line and a power pad are electrically insulated from each other.

Aspects of embodiments of the present disclosure provide a method of manufacturing a display device, in which a panel-lighting-test line and a power pad are electrically insulated from each other.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a display panel including a display area having a scan area, and having a power area on one side of the scan area, and a non-display area surrounding the display area, and having a pad portion on one side of the non-display area, the pad portion including a first pad including line pads connected to lines of the scan area, a second pad including line pads, and a power pad configured to supply an off signal to a line of the lines of the power area and connected to lines of the power area, and a panel-lighting-test line on at least one side of the power pad, and spaced apart from the power pad.

The panel-lighting-test line and the line of the power area may extend in a same direction.

The second pad may further include a first connection electrode that overlaps the power pad.

The first connection electrode may include a first lower connection electrode.

The display device may further include a substrate, a first conductive layer on the substrate, and including the panel-lighting-test line, a second conductive layer on the first conductive layer, and including the power pads, and a third conductive layer on the second conductive layer, and including the first lower connection electrode.

The first connection electrode may further include a first upper connection electrode on the first lower connection electrode.

The first upper connection electrode may be directly on the first lower connection electrode, and may include a fourth conductive layer on the third conductive layer and including the first upper connection electrode.

The display device may further include an interlayer dielectric layer between the second conductive layer and the third conductive layer, and a via layer between the interlayer dielectric layer and the third conductive layer, wherein the first lower connection electrode is connected to the power pad through a contact hole passing through the via layer and the interlayer dielectric layer.

The first connection electrode and the power pad might not be connected to each other.

According to one or more embodiments of the present disclosure, there is provided a display device including a display panel including a display area having a scan area, and having a power area on one side of the scan area, and a non-display area surrounding the display area, and having a pad portion on one side thereof and including a first pad including line pads connected to lines of the scan area, and a second pad including line pads, and a power pad connected to lines of the power area and configured to supply an off signal to a line of the lines of the power area, wherein any one of the line pads of the first pad or any one of the line pads of the second pad is connected to a vertical voltage line that is electrically connected to the line of the power area.

The power pad may be provided in a plural number, wherein the panel-lighting-test line is between adjacent ones of the power pads.

The second pad may further include a first connection electrode that overlaps the power pad and that includes a first lower connection electrode.

The display device may further include a substrate, a first conductive layer on the substrate, and including the panel-lighting-test line, a second conductive layer on the first conductive layer, and including the power pad, and a third conductive layer on the second conductive layer, and including the first lower connection electrode, which further includes a first upper connection electrode directly on the first lower connection electrode.

According to one or more embodiments of the present disclosure, there is provided a method of manufacturing a display device, the method including preparing a target panel display panel including a display area having a scan area, and having a power area on one side of the scan area, a non-display area surrounding the display area, and having a pad portion on one side thereof, and an outer area outside the non-display area, and having a lighting-test pad portion extended along a first direction, and cutting the outer area of the target panel, wherein, in the operation of preparing the target panel, the pad portion includes a first pad including line pads connected to lines of the scan area, and respectively extended along the first direction, and a second pad including line pads, and a power pad connected to lines of the power area, extended along the first direction, configured to supply an off signal to a line of the lines of the power area, and on a same line as the lighting-test pad portion in the first direction.

In the operation of preparing the target panel, the target panel may further include a panel-lighting-test line extended from the outer area to the second pad along the first direction.

The second pad may further include a first connection electrode that overlaps the power pad, wherein the outer area further includes a second connection electrode that overlaps the lighting-test pad portion.

The first connection electrode may include a first lower connection electrode, wherein the second connection electrode includes a second lower connection electrode positioned on a same layer as the first lower connection electrode.

The first connection electrode may further include a first upper connection electrode on the first lower connection electrode, wherein the second connection electrode further includes a second upper connection electrode positioned on a same layer as the first upper connection electrode and on the second lower connection electrode.

An interlayer dielectric layer may be between the second conductive layer and the third conductive layer, wherein a via layer is between the interlayer dielectric layer and the third conductive layer, and wherein the first lower connection electrode is connected to the power pad through a contact hole passing through the via layer and the interlayer dielectric layer.

According to the aforementioned and other embodiments of the present disclosure, a panel-lighting-test line and a power pad may be electrically insulated from each other.

BRIEF DESCRIPTION OF THE DRAWINGS

The above and other embodiments of the present disclosure will become more apparent by describing embodiments thereof with reference to the attached drawings, in which.

DETAILED DESCRIPTION

Figure 1:
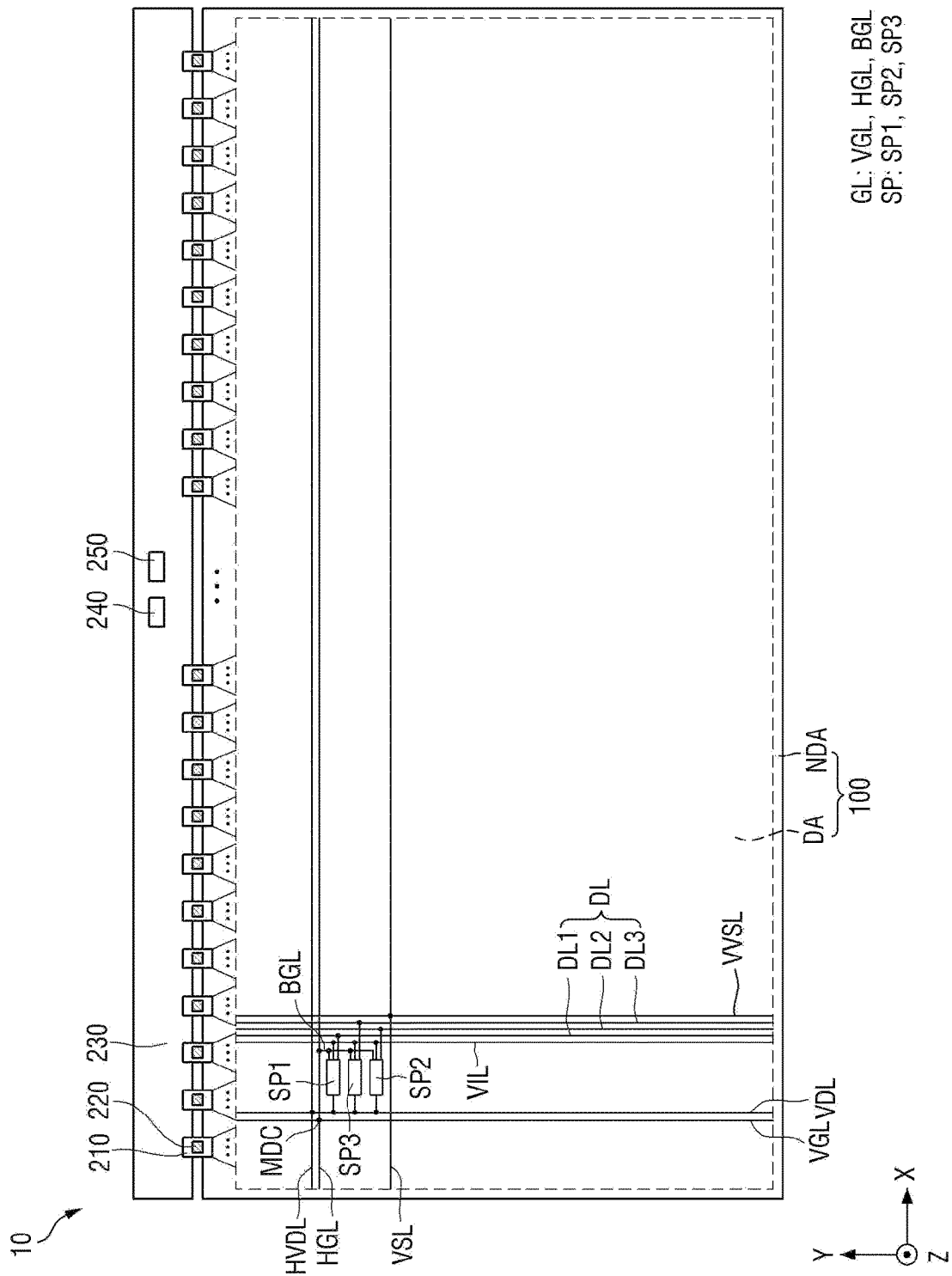
FIG. 1 is a plan view illustrating a display device according to one or more embodiments.

Aspects of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element's or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, the term "and/or" includes any and all combinations of one or more of the associated listed items. For example, the expression, such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer, or section described below could be termed a second element, component, region, layer, or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random-access memory (RAM). The computer program instructions may also be stored in other non-transitory computer readable media, such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device according to one or more embodiments.

In the present disclosure, "upper," "top," and "upper surface" refer to an upper direction based on a display device 10, that is, Z-axis direction, and "lower," "bottom," and "lower surface" refer to a lower direction based on the display device 10, that is, an opposite direction of the Z-axis direction. Also, "left," "right," "upper" and "lower" refer to a direction when the display device 10 is viewed on a plane. For example, "left" refers to an opposite direction of X-axis direction, "right" refers to the X-axis direction, "upper" refers to Y-axis direction, and "lower" refers to an opposite direction of the Y-axis direction.

Referring to FIG. 1, the display device 10 is a device that displays a moving image or a still image. The display device 1 may be used as a display screen of various products, such as a television, a laptop computer, a monitor, an advertising board, and a device for Internet of things (IoT) as well as portable electronic devices, such as a mobile phone, a smart phone, a tablet personal computer (PC), a smart watch, a watch phone, a mobile communication terminal, an electronic notebook, an electronic book, a navigator, and an ultra-mobile PC (UMPC).

The display device 10 may include a display panel 100, a flexible film 210, a display driver 220, a circuit board 230, a timing controller 240, and a power supply 250.

The display panel 100 may have a rectangular shape on a plane. For example, the display panel 100 may have a rectangular planar shape having a long side of a first direction (X-axis direction) and a short side of a second direction (Y-axis direction). Edges where the long sides of the first direction (X-axis direction) and the short sides of the second direction (Y-axis direction) meet may be formed at a right angle, or may be formed in a round shape having a curvature (e.g., predetermined curvature). A planar shape of the display panel 100 is not limited to a rectangle, but may be formed in other polygonal shape, a circular shape, or an elliptical shape. For example, the display panel 100 may be formed to be flat, but is not limited thereto. For another example, the display panel 100 may be bent at a curvature (e.g., predetermined curvature).

The display panel 100 may include a display area DA and a non-display area NDA.

The display area DA is an area for displaying an image, and may be defined as a central area of the display panel 100. The display area DA may include a pixel SP, a gate line GL, a data line DL, an initialization voltage line VIL, a first voltage line VDL, a horizontal voltage line HVDL, a vertical voltage line VVSL, and a second voltage line VSL. Pixels SP may be formed in each pixel area crossed by a plurality of data lines DL and a plurality of gate lines GL. The pixel SP may include first to third pixels SP1, SP2, and SP3. Each of the first to third pixels SP1, SP2, and SP3 may be connected to one horizontal gate line HGL and to one data line DL. Each of the first to third pixels SP1, SP2, and SP3 may be defined as a minimum unit area for outputting light.

The first pixel SP1 may emit light of a first color, such as red light, the second pixel SP2 may emit light of a second color, such as green light, and the third pixel SP3 may emit light of a third color, such as blue light. A pixel circuit of the first pixel SP1, a pixel circuit of the third pixel SP3, and a pixel circuit of the second pixel SP2 may be arranged in the opposite direction of the second direction (Y-axis direction), but the order of the pixel circuits is not limited thereto.

The gate line GL may include a vertical gate line VGL, a horizontal gate line HGL, and an auxiliary gate line BGL.

The plurality of vertical gate lines VGL may be connected to the display driver 220, may extend in the second direction (Y-axis direction), and may be spaced apart from each other in the first direction (X-axis direction). The vertical gate line VGL may be a first gate line. The vertical gate line VGL may be located in parallel with the data line DL. The plurality of horizontal gate lines HGL may extend in the first direction (X-axis direction), and may be spaced apart from each other in the second direction (Y-axis direction). The horizontal gate line HGL may be a second gate line. The plurality of horizontal gate lines HGL may cross the plurality of vertical gate lines VGL. For example, one horizontal gate line HGL may be connected to one of the plurality of vertical gate lines VGL through a contact portion MDC. The contact portion MDC may correspond to a portion in which the horizontal gate line HGL is inserted into a contact hole and is in contact with the vertical gate line VGL. The auxiliary gate line BGL may extend from the horizontal gate line HGL to supply a gate signal to the first to third pixels SP1, SP2, and SP3.

The plurality of data lines DL may extend in the second direction (Y-axis direction), and may be spaced apart from each other in the first direction (X-axis direction). The plurality of data lines DL may include first to third data lines DL1, DL2, and DL3. Each of the first to third data lines DL1, DL2, and DL3 may supply a data voltage to each of the first to third pixels SP1, SP2, and SP3.

The plurality of initialization voltage lines VIL may extend in the second direction (Y-axis direction), and may be spaced apart from each other in the first direction (X-axis direction). The initialization voltage line VIL may supply an initialization voltage received from the display driver 220 to the pixel circuits of each of the first to third pixels SP1, SP2, and SP3. The initialization voltage line VIL may receive a sensing signal from the pixel circuit of each of the first to third pixels SP1, SP2, and SP3 to supply the sensing signal to the display driver 220.

The plurality of first voltage lines VDL may extend in the second direction (Y-axis direction), and may be spaced apart from each other in the first direction (X-axis direction). The first voltage line VDL may supply a driving voltage or high potential voltage received from the power supply 250 to the first to third pixels SP1, SP2, and SP3.

The plurality of horizontal voltage lines HVDL may extend in the first direction (X-axis direction), and may be spaced apart from each other in the second direction (Y-axis direction). The horizontal voltage line HVDL may be connected to the first voltage line VDL. The horizontal voltage line HVDL may supply the driving voltage or high potential voltage to the first voltage line VDL.

The vertical voltage lines VVSL may extend in the second direction (Y-axis direction), and may be spaced apart from each other in the first direction (X-axis direction). The vertical voltage line VVSL may be connected to the second voltage line VSL. The vertical voltage line VVSL may supply a low potential voltage received from the power supply 250 to the second voltage line VSL.

The second voltage lines VSL may extend in the first direction (X-axis direction), and may be spaced apart from each other in the second direction (Y-axis direction). The second voltage line VSL may supply the low potential voltage to the first to third pixels SP1, SP2, and SP3.

A connection relationship of the pixel SP, the gate line GL, the data line DL, the initialization voltage line VIL, the first voltage line VDL, and the second voltage line VSL may be designed and changed depending on the number and arrangement of the pixels SP.

The non-display area NDA may be defined as an area in the display panel 100 excluding the display area DA. For example, the non-display area NDA may include a vertical gate line VGL, a data line DL, an initialization voltage line VIL, a first voltage line VDL, fan-out lines connecting each of the vertical voltage lines VSL with the display driver 220, and a pad portion connected to the flexible film 210.

Input terminals provided on one side of the flexible film 210 may be attached to the circuit board 230 by a film attachment process, and output terminals provided on the other side of the flexible film 210 may be attached to the pad portion by the film attachment process. For example, the flexible film 210 may be bent like a tape carrier package or a chip on film. The flexible film 210 may be bent toward a lower portion of the display panel 100 to reduce a bezel area of the display device 10.

The display driver 220 may be packaged on the flexible film 210. For example, the display driver 220 may be implemented as an integrated circuit (IC). The display driver 220 may receive digital video data and a data control signal from the timing controller 240, may convert the digital video data into an analog data voltage in accordance with the data control signal, and may supply the analog data voltage to the data lines DL through the fan-out lines. The display driver 220 may generate a gate signal in accordance with a gate control signal supplied from the timing controller 240, and may sequentially supply the gate signal to the plurality of vertical gate lines VGL in accordance with a set order. Therefore, the display driver 220 may concurrently or substantially simultaneously serve as a data driver and a gate driver. The display device 10 may include a display driver 220 located on an upper side of the non-display area NDA, thereby reducing or minimizing sizes of left, right, and lower sides of the non-display area NDA.

The circuit board 230 may support the timing controller 240 and the power supply 250, and may supply a signal and a power source to the display driver 220. For example, the circuit board 230 may supply a signal supplied from the timing controller 240, and may supply a power voltage supplied from the power supply 250, to the display driver 220 to display an image in each pixel. To this end, a signal transmission line and a power line may be provided on the circuit board 230.

The timing controller 240 may be packaged on the circuit board 230, and may receive image data and a timing synchronization signal, which are supplied from a display driving system or a graphic device through a user connector provided on the circuit board 230. The timing controller 240 may generate digital video data by aligning the image data to be suitable for a pixel arrangement structure based on the timing synchronization signal, and may supply the generated digital video data to the display driver 220. The timing controller 240 may generate a data control signal and a gate control signal based on the timing synchronization signal. The timing controller 240 may control timing of a supply of the data voltage of the display driver 220 based on the data control signal, and may control timing of a supply of the gate signal of the display driver 220 based on the gate control signal.

The power supply 250 may be located on the circuit board 230 to supply the power voltage to the display driver 220 and the display panel 100. For example, the power supply 250 may generate a driving voltage or high potential voltage to supply the generated driving voltage or high potential voltage to the first voltage line VDL, may generate a low potential voltage to supply the generated low potential voltage to the vertical voltage line VVSL, and may generate an initialization voltage to supply the generated initialization voltage to the initialization voltage line VIL.

Figure 2:
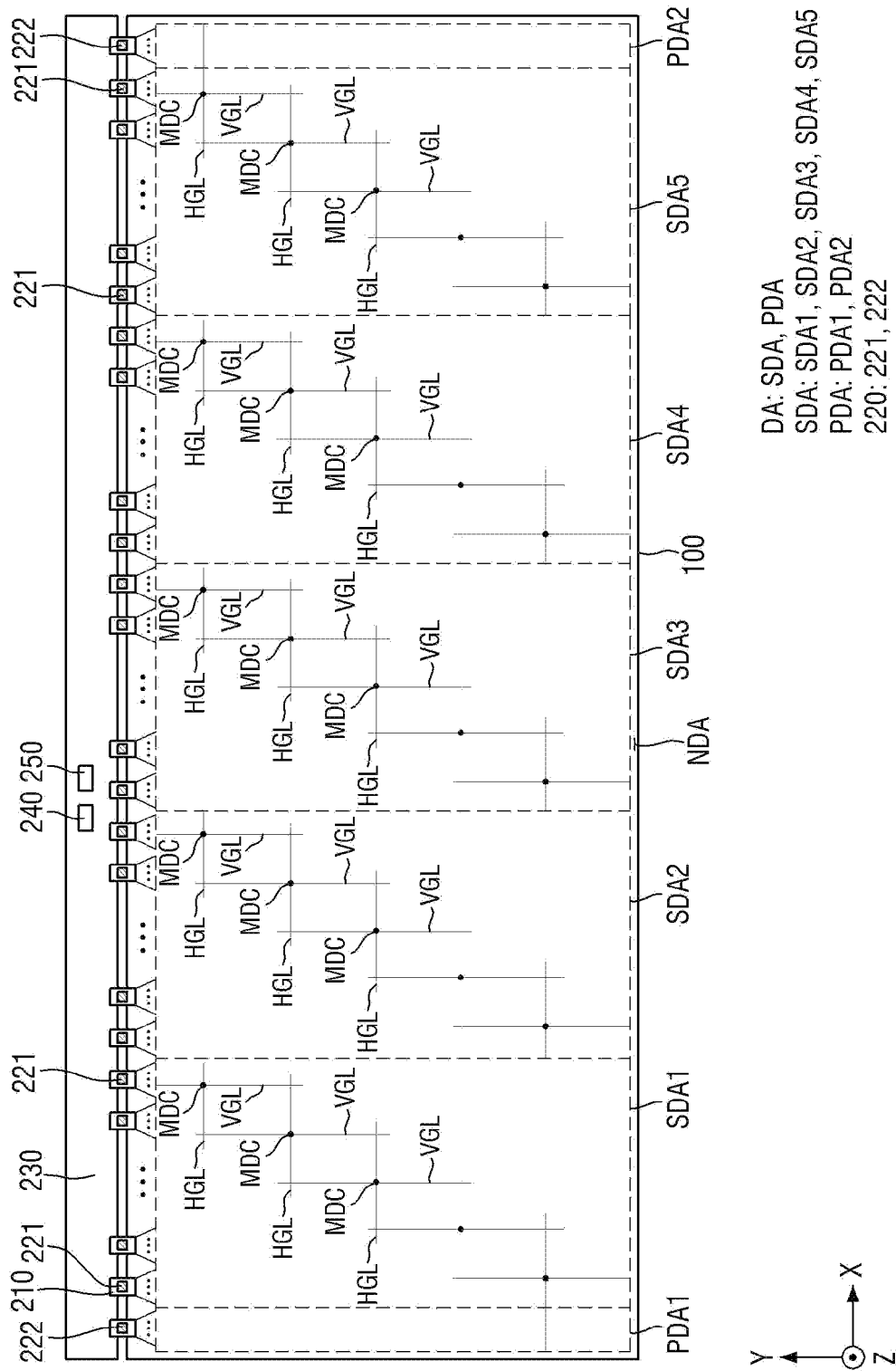
FIG. 2 is a plan view illustrating a scan area and a power area in a display device according to one or more embodiments.
Figure 3:
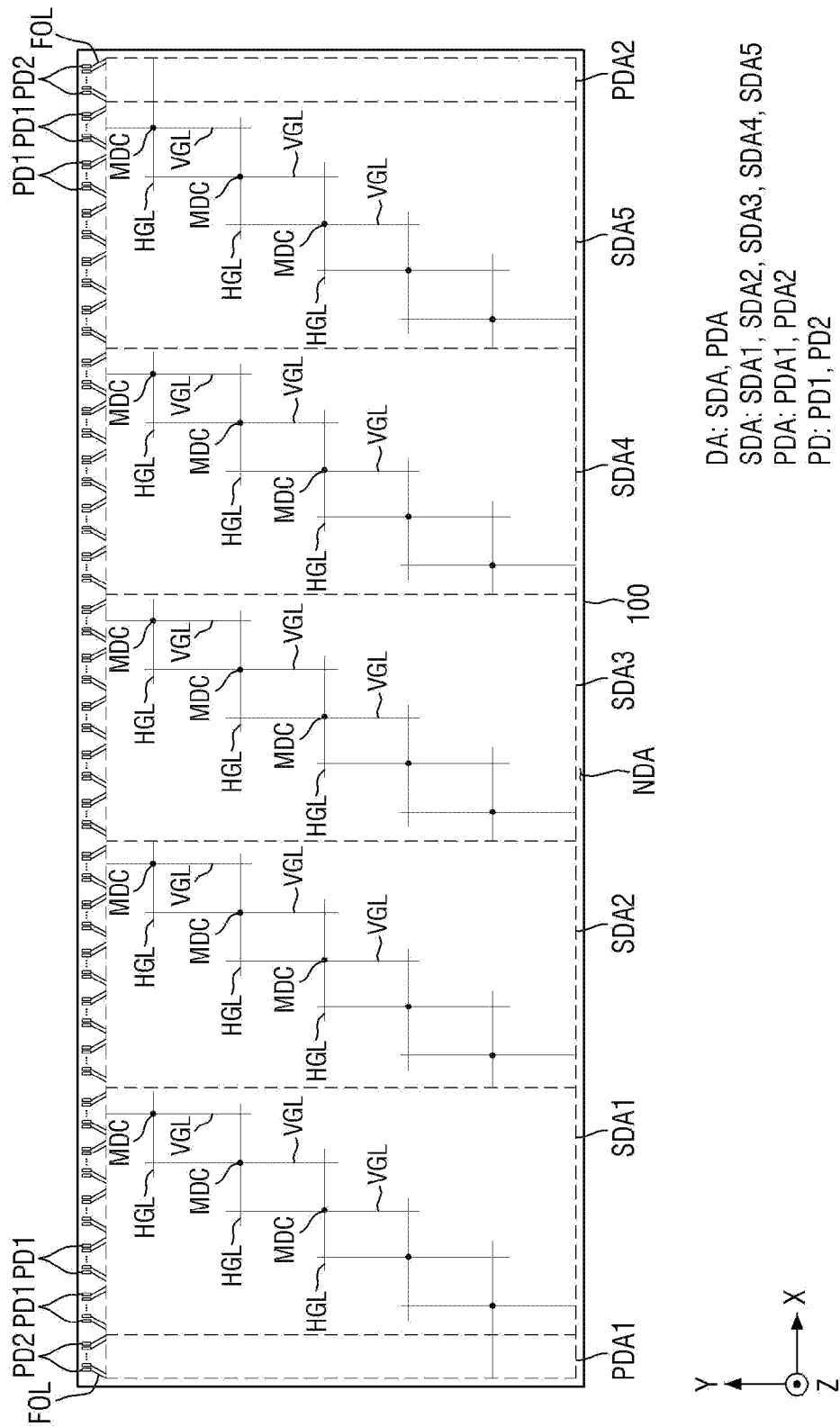
FIG. 3 is a plan view illustrating first and second pads in a display device according to one or more embodiments.

FIG. 2 is a plan view illustrating a scan area and a power area in a display device according to one or more embodiments, and FIG. 3 is a plan view illustrating first and second pads in a display device according to one or more embodiments.

Referring to FIGS. 2 and 3, the display panel 100 may include a display area DA and a non-display area NDA. The display area DA may include a scan area SDA and a power area PDA.

The scan area SDA may include first to fifth scan areas SDA1, SDA2, SDA3, SDA4, and SDA5. The first to fifth scan areas SDA1, SDA2, SDA3, SDA4, and SDA5 may be sequentially located in the first direction (X-axis direction). Each of the first to fifth scan areas SDA1, SDA2, SDA3, SDA4, and SDA5 may correspond to a first pad PD1. Each of the first to fifth scan areas SDA1, SDA2, SDA3, SDA4, and SDA5 may include a vertical gate line VGL and a horizontal gate line HGL.

The vertical gate line VGL may be electrically connected to the first pad PD1 through a fan-out line FOL. Each of the plurality of vertical gate lines VGL may cross each of the plurality of horizontal gate lines HGL. For example, one vertical gate line VGL may be connected to one of the plurality of horizontal gate lines HGL through a contact portion MDC. One vertical gate line VGL may be insulated from the other horizontal gate line HGL. Therefore, the vertical gate lines VGL and the horizontal gate lines HGL may be insulated from each other at intersection points except the contact portion MDC.

The contact portion MDC of the first scan area SDA1 may be located on an extension line (e.g., an imaginary extension line) connecting a right upper end of the first scan area SDA1 to a left lower end of the first scan area SDA1. The contact portion MDC of the second scan area SDA2 may be located on an extension line (e.g., an imaginary extension line) connecting a right upper end of the second scan area SDA2 to a left lower end of the second scan area SDA2. The contact portion MDC of the third scan area SDA3 may be located on an extension line (e.g., an imaginary extension line) connecting a right upper end of the third scan area SDA3 to a left lower end of the third scan area SDA3. The contact portion MDC of the fourth scan area SDA4 may be located on an extension line (e.g., an imaginary extension line) connecting a right upper end of the fourth scan area SDA4 to a left lower end of the fourth scan area SDA4. The contact portion MDC of the fifth scan area SDA5 may be located on an extension line (e.g., an imaginary extension line) connecting a right upper end of the fifth scan area SDA5 to a left lower end of the fifth scan area SDA5. Therefore, the plurality of contact portions MDC may be arranged along a diagonal direction between the first direction (X-axis direction) and the second direction (Y-axis direction) in each of the first to fifth scan areas SDA1, SDA2, SDA3, SDA4, and SDA5.

The power area PDA may include first and second power areas PDA1 and PDA2. The first and second power areas PDA1 and PDA2 may be located at both edges of the display area DA. The first power area PDA1 may be located at a left edge of the display area DA. The second power area PDA2 may be located at a right edge of the display area DA. The first power area PDA1 may be located on a left side of the first scan area SDA1, and the second power source area PDA2 may be located on a right side of the fifth scan area SDA5. Each of the first and second power areas PDA1 and PDA2 may correspond to the second pad PD2. Each of the first and second power areas PDA1 and PDA2 may include a horizontal gate line HGL.

The horizontal gate line HGL of the power area PDA may be electrically connected to the vertical gate line VGL of the scan area SDA. The horizontal gate line HGL of the first power area PDA1 may be electrically connected to the vertical gate line VGL of the first scan area SDA1, and the horizontal gate line HGL of the second power area PDA2 may be electrically connected to the vertical gate line VGL of the fifth scan area SDA5.

The display driver 220 may include a first display driver 221 and a second display driver 222. The first display driver 221 may be electrically connected to the first pad PD1. The first display driver 221 may supply a gate signal to the vertical gate line VGL of the scan area SDA. The first display driver 221 may supply the data voltage to a data line of the scan area SDA, and may supply the power voltage to a power line of the scan area SDA. In this case, the power voltage may be a driving voltage, a high potential voltage, a low potential voltage, or an off voltage. Therefore, the first display driver 221 may serve as a data driver and a gate driver.

The second display driver 222 may be electrically connected to the second pad PD2. The second display driver 222 may supply the data voltage to a data line of the power area PDA, and may supply the power voltage to a power line of the power area PDA. Therefore, the second display driver 222 may serve as a data driver.

Therefore, the data line DL may receive the data voltage from the first and second display drivers 221 and 222 located above the non-display area NDA, and the vertical gate line GL may receive the gate signal from the first display driver 221 located above the non-display area NDA, so that the display device 10 may reduce or minimize the sizes of the left, right, and lower sides of the non-display area NDA.

Figure 4:
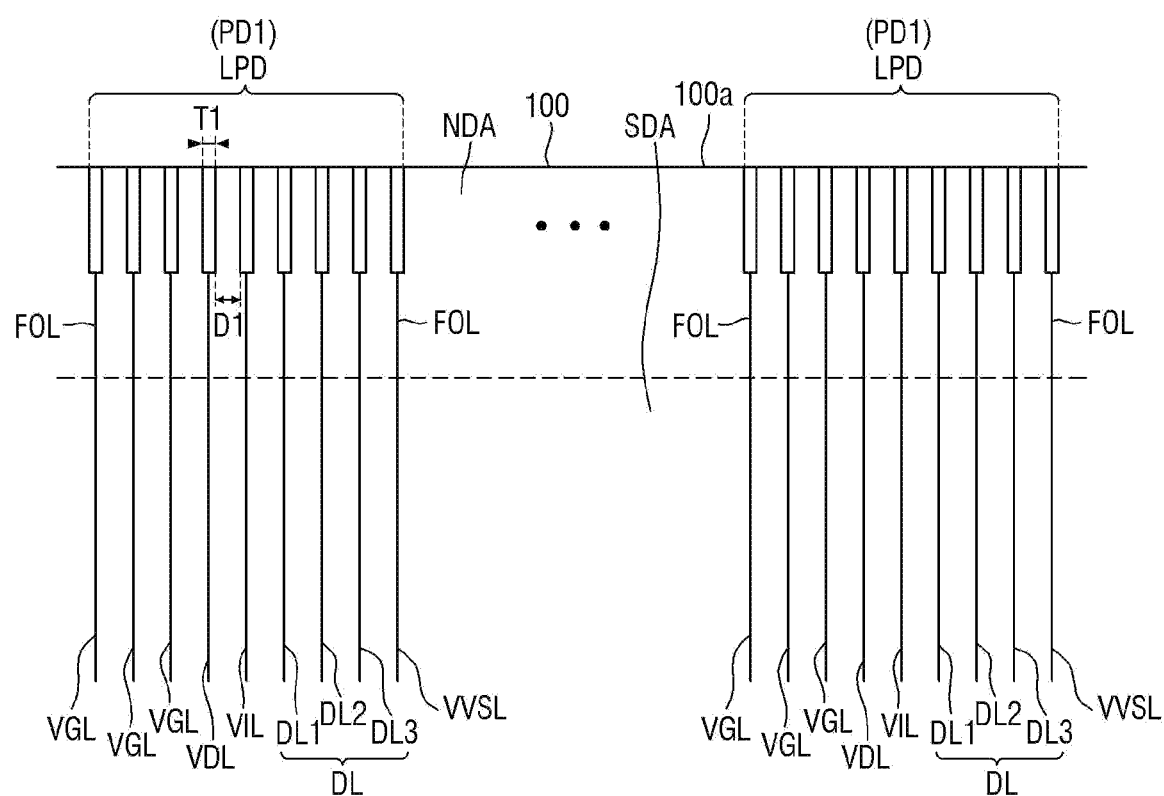
FIG. 4 is a view illustrating a connection relationship between a first pad and lines in a display device according to one or more embodiments.

FIG. 4 is a view illustrating a connection relationship between a first pad and lines in a display device according to one or more embodiments.

Referring to FIG. 4, the first pad PD1 may be electrically connected to the first display driver 221. The first pad PD1 may include a plurality of line pads LPD. The plurality of line pads LPD may be respectively connected, one-to-one, to lines of the scan area SDA. The plurality of line pads LPD may have substantially the same first width T1, and may be spaced apart from each other by as much as a first distance D1. The fan-out line FOL may extend from the first pad PD1 to the scan area SDA. The first pad PD1 may be electrically connected to the vertical gate line VGL, the first voltage line VDL, the initialization voltage line VIL, the data line DL, and the vertical voltage line VVSL through the fan-out line FOL. The number of line pads LPD may be determined depending on the number of lines in the scan area SDA. Therefore, the first pad PD1 may supply the signal or voltage received from the first display driver 221 to the pixels SP of the scan area SDA. In FIG. 4, a side 100a of the display panel 100 is shown. Ends of the plurality of first pads PD1 and ends of the second pads PD2, which will be described later, may be aligned with the side 100a of the display panel 100, but are not limited thereto.

Figure 5:
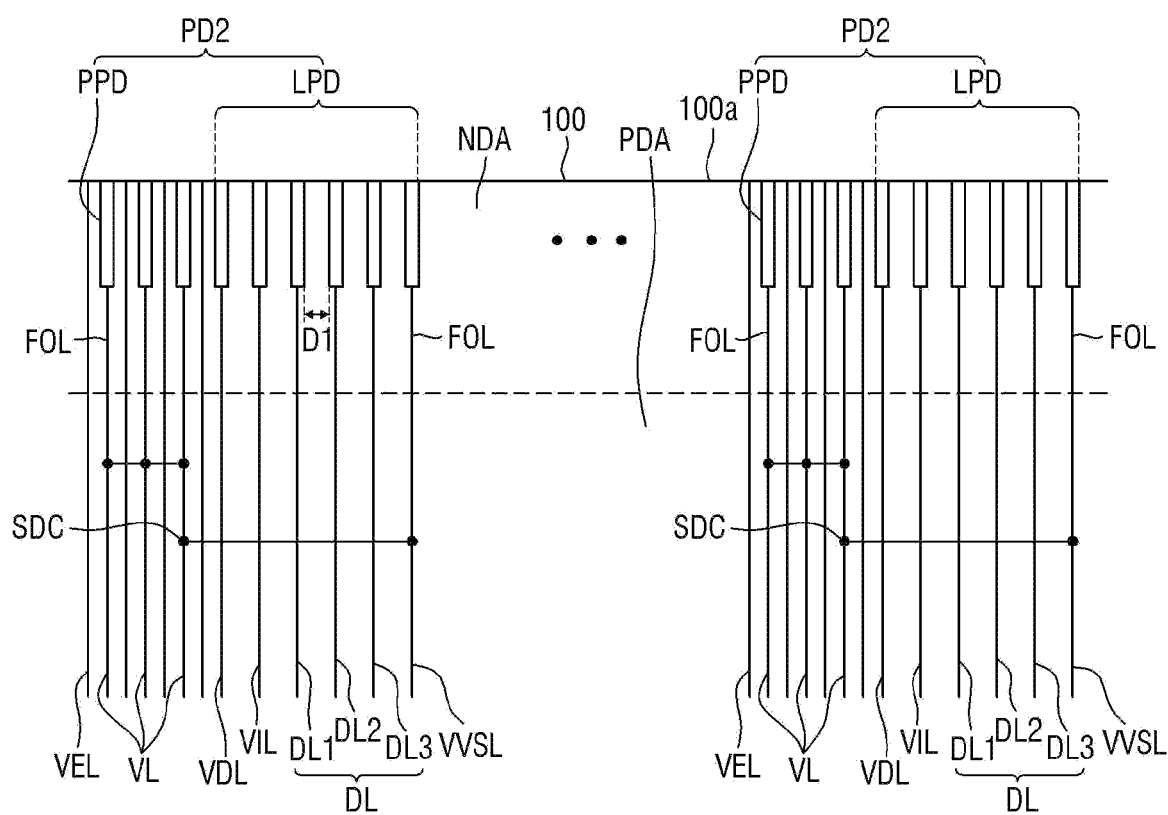
FIG. 5 is a view illustrating a connection relationship between a second pad and lines in a display device according to one or more embodiments.

FIG. 5 is a view illustrating a connection relationship between a second pad and lines in a display device according to one or more embodiments.

Referring to FIG. 5, the second pad PD2 may be electrically connected to the second display driver 222. The second pad PD2 may include a plurality of line pads LPD and a plurality of power pads PPD. The plurality of line pads LPD may be connected to lines of the power area PDA in one-to-one. The plurality of line pads LPD may have substantially the same first width T1 (e.g., of FIG. 4), and adjacent line pads LPD may be spaced apart from each other by as much as a first distance D1. The power pad PPD may be connected, one-to-one, to the lines of the power area PDA. The plurality of power pads PPD may be connected to a plurality of lines of the power area PDA. In some embodiments, one power pad PPD may be connected to the plurality of lines of the power area PDA.

The fan-out line FOL may extend from the second pad PD2 to the power area PDA. The power pad PPD may be electrically connected to the power line VL through the fan-out line FOL. In this case, the power line VL may supply a driving voltage, a high potential voltage, a low potential voltage, or an off voltage to the power area PDA. In one or more embodiments, the power line VL may include an off-power line that supplies the off voltage to the power area PDA. The line pad LPD may be electrically connected to the first voltage line VDL, the initialization voltage line VIL, the data line DL, and the vertical voltage line VVSL through the fan-out line FOL. In one or more embodiments, the power line VL may be electrically connected to the vertical voltage line VVSL through a contact portion SDC. That is, the off voltage may be the same as the low potential voltage supplied from the power supply 250 to the vertical voltage line VVSL.

The plurality of power lines VL may extend in the second direction (Y-axis direction), and may be spaced apart from each other in the first direction (X-axis direction). Adjacent voltage lines VL may be electrically connected to each other. The number of line pads LPD and power pads PPD may be determined depending on the number of lines in the power area PDA. Therefore, the second pad PD2 may supply the signal or voltage received from the second display driver 222 to the pixels SP of the power area PDA.

The off-power line among the plurality of power lines VL may be located on the same layer as the vertical gate line VGL. The off-power line among the plurality of power lines VL may extend in the same direction as the vertical gate lines VGL, but might not be connected to the horizontal gate line HGL, unlike the vertical gate lines VGL.

The second pad PD2 may further include a panel-lighting-test line VEL located on at least one side of the power pad PPD and spaced apart from the power pad PPD.

The power pad PPD and the panel-lighting-test line VEL may be provided in a plural number, and at least one of the panel-lighting-test lines VEL may be located between the power pads PPD adjacent to each other. The panel-lighting-test lines VEL may respectively extend in the same direction as the extension direction of the plurality of power lines VL. The panel-lighting-test line and the power line are electrically connected to each other in a process of manufacturing a pre-designed display device, so that a voltage (e.g., predetermined voltage) is applied to the power line through the panel-lighting-test line during a panel-lighting test. However, in a process of manufacturing a display device according to one or more embodiments, a voltage applied to the panel-lighting-test line and a voltage applied to the power line are different from each other, so that the panel-lighting-test line and the power line should be electrically insulated from each other in the process of manufacturing a pre-designed display device. This will be described in detail with reference to a method of manufacturing a display device.

Figure 6:
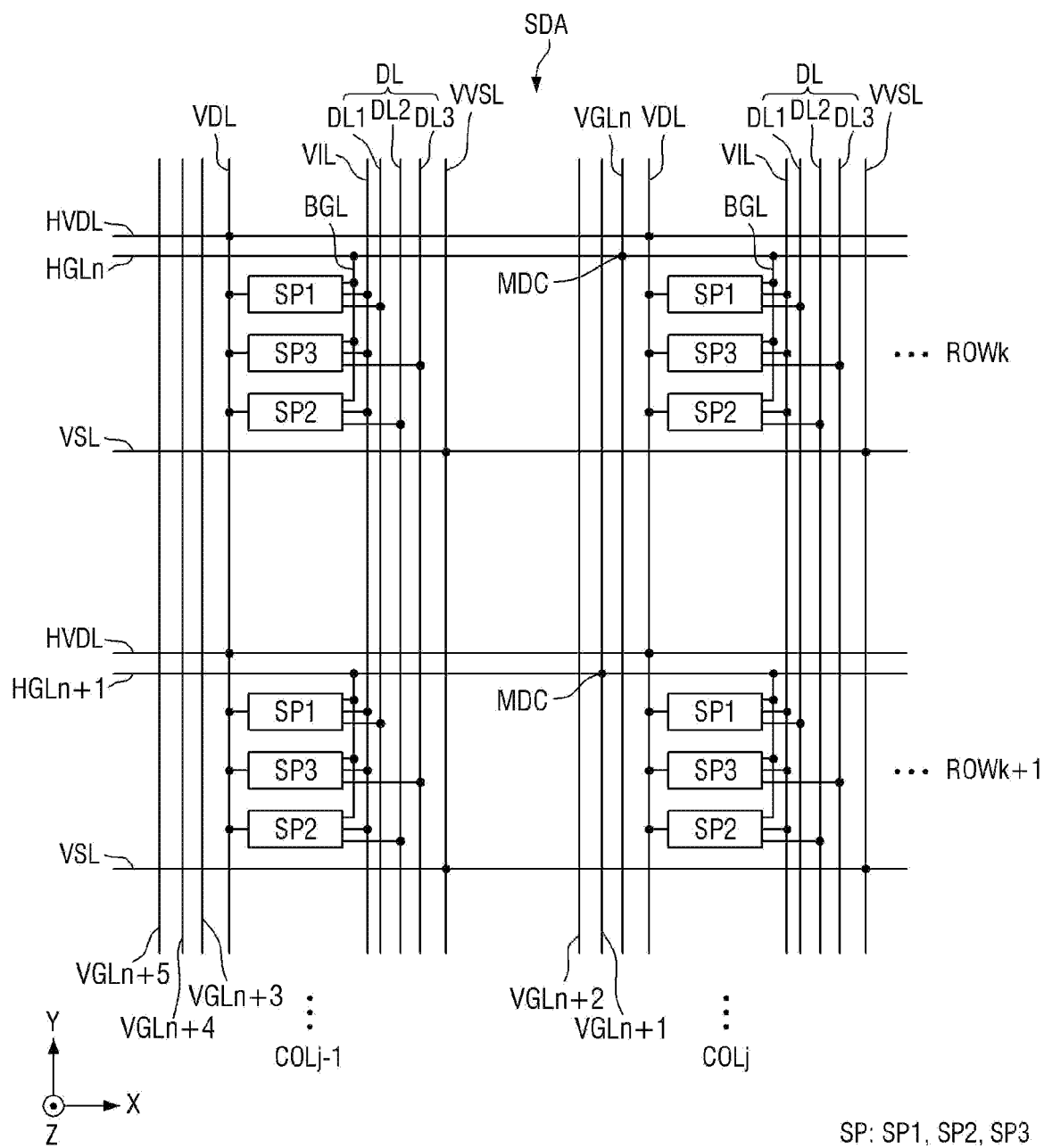
FIG. 6 is a view illustrating a pixel and lines of a scan area in a display device according to one or more embodiments.

FIG. 6 is a view illustrating a pixel and lines of a scan area in a display device according to one or more embodiments.

Referring to FIG. 6, the scan area SDA may include a pixel SP, a vertical gate line VGL, a horizontal gate line HGL, an auxiliary gate line BGL, a first voltage line VDL, a horizontal voltage line HVDL, an initialization voltage line VIL, a data line DL, and a vertical voltage line VVSL. The pixel SP may include first to third pixels SP1, SP2, and SP3. A pixel circuit of the first pixel SP1, a pixel circuit of the third pixel SP3, and a pixel circuit of the second pixel SP2 may be arranged in the opposite direction of the second direction (Y-axis direction), but the order of the pixel circuits is not limited thereto.

The plurality of vertical gate lines VGL may extend in the second direction (Y-axis direction). The plurality of vertical gate lines VGL may be located on a left side of the first voltage line VDL. The plurality of vertical gate lines VGL may be located between the vertical voltage line VVSL and the first voltage line VDL. The vertical gate line VGL of the scan area SDA may be connected between the first display driver 221 and the horizontal gate line HGL. Each of the plurality of vertical gate lines VGL may cross the plurality of horizontal gate lines HGL. The vertical gate line VGL may supply the gate signal received from the first display driver 221 to the horizontal gate line HGL.

For example, an (n)th vertical gate line VGLn (n is a positive integer), an (n+1)th vertical gate line VGLn+1, and an (n+2)th vertical gate line VGLn+2 may be located on a left side of the pixel SP located in a (j)th column COLj (j is an integer equal to or greater than 2). The (n)th, (n+1)th, and (n+2)th vertical gate lines VGLn, VGLn+1, and VGLn+2 may be located in parallel between the data line DL connected to the pixel SP located in a (j−1)th column COLj−1 and the first voltage line VDL connected to the pixel SP located in the (j)th column COLj. (n+3)th, (n+4)th and (n+5)th vertical gate lines VGLn+3, VGLn+4, and VGLn+5 may be located on the left side of the first voltage line VDL connected to the pixel SP located in the (j−1)th column COLj−1. The (n)th vertical gate line VGLn may be connected to an (n)th horizontal gate line HGLn through the contact portion MDC, and may be insulated from the other horizontal gate lines HGL. The (n+1)th vertical gate line VGLn+1 may be connected to an (n+1)th horizontal gate line HGLn+1 through the contact portion MDC, and may be insulated from the other horizontal gate lines HGL.

The horizontal gate line HGL may extend in the first direction (X-axis direction). The horizontal gate line HGL may be located above the pixel circuit of the first pixel SP1. The horizontal gate line HGL may be connected between the vertical gate line VGL and the auxiliary gate line BGL. The horizontal gate line HGL may supply the gate signal received from the vertical gate line VGL to the auxiliary gate line BGL.

For example, the (n)th horizontal gate line HGLn may be located above the pixel circuit of the first pixel SP1 located in a (k)th row ROWk (k is a positive integer). The (n)th horizontal gate line HGLn may be connected to the (n)th vertical gate line VGLn through the contact portion MDC, and may be insulated from the other vertical gate lines VGL. The (n+1)th horizontal gate line HGLn+1 may be located above the pixel circuit of the first pixel SP1 located in a (k+1)th row ROWk+1. The (n+1)th horizontal gate line HGLn+1 may be connected to the (n+1)th vertical gate line VGLn+1 through the contact portion MDC, and may be insulated from the other vertical gate lines VGL.

The auxiliary gate line BGL may extend from the horizontal gate line HGL in the opposite direction of the second direction (Y-axis direction). The auxiliary gate line BGL may be located on a right side of the pixel circuit of each of the first to third pixels SP1, SP2, and SP3. The auxiliary gate line BGL may supply the gate signal received from the horizontal gate line HGL to the pixel circuit of each of the first to third pixels SP1, SP2, and SP3.

The first voltage line VDL may extend in the second direction (Y-axis direction). The first voltage line VDL may be located on a left side of the pixel circuit of each of the first to third pixels SP1, SP2, and SP3. The first voltage line VDL may supply a driving voltage or high potential voltage to each transistor of the first to third pixels SP1, SP2, and SP3.

The horizontal voltage line HVDL may extend in the first direction (X-axis direction). The horizontal voltage line HVDL may be located above the horizontal gate line HGL. For example, the horizontal voltage line HVDL may be located above the (n)th horizontal gate line HGLn or the (n+1)th horizontal gate line HGLn+1. The horizontal voltage line HVDL may be connected to the first voltage line VDL. The horizontal voltage line HVDL may supply the driving voltage or high potential voltage to the first voltage line VDL.

The initialization voltage line VIL may extend in the second direction (Y-axis direction). The initialization voltage line VIL may be located on a right side of the auxiliary gate line BGL. The initialization voltage line VIL may be located between the auxiliary gate line BGL and the data line DL. The initialization voltage line VIL may supply an initialization voltage to each of the pixel circuit of each of the first to third pixels SP1, SP2, and SP3. The initialization voltage line VIL may receive a sensing signal from the pixel circuit of each of the first to third pixels SP1, SP2, and SP3 to supply the sensing signal to the first display driver 221.

The plurality of data lines DL may extend in the second direction (Y-axis direction). The plurality of data lines DL may supply a data voltage to the first to third pixels SP1, SP2, and SP3. The plurality of data lines DL may include first to third data lines DL1, DL2, and DL3.

The first data line DL1 may extend in the second direction (Y-axis direction). The first data line DL1 may be located on a right side of the initialization voltage line VIL. The first data line DL1 may supply the data voltage received from the first display driver 221 to the pixel circuit of the first pixel SP1.

The second data line DL2 may extend in the second direction (Y-axis direction). The second data line DL2 may be located on a right side of the first data line DL1. The second data line DL2 may supply the data voltage received from the first display driver 221 to the pixel circuit of the second pixel SP2.

The third data line DL3 may extend in the second direction (Y-axis direction). The third data line DL3 may be located on a right side of the second data line DL2. The third data line DL3 may supply the data voltage received from the first display driver 221 to the pixel circuit of the third pixel SP3.

The vertical voltage line VVSL may extend in the second direction (Y-axis direction). The vertical voltage line VVSL may be located on a right side of the third data line DL3. The vertical voltage line VVSL may be connected between the power supply 250 and the second voltage line VSL. The vertical voltage line VVSL may supply the low potential voltage supplied from the power supply 250 to the second voltage line VSL.

The second voltage line VSL may extend in the first direction (X-axis direction). The second voltage line VSL may be located below the pixel circuit of the second pixel SP2. The second voltage line VSL may supply the low potential voltage received from the vertical voltage line VVSL to the light emitting element layer of each of the first to third pixels SP1, SP2, and SP3.

Figure 7:
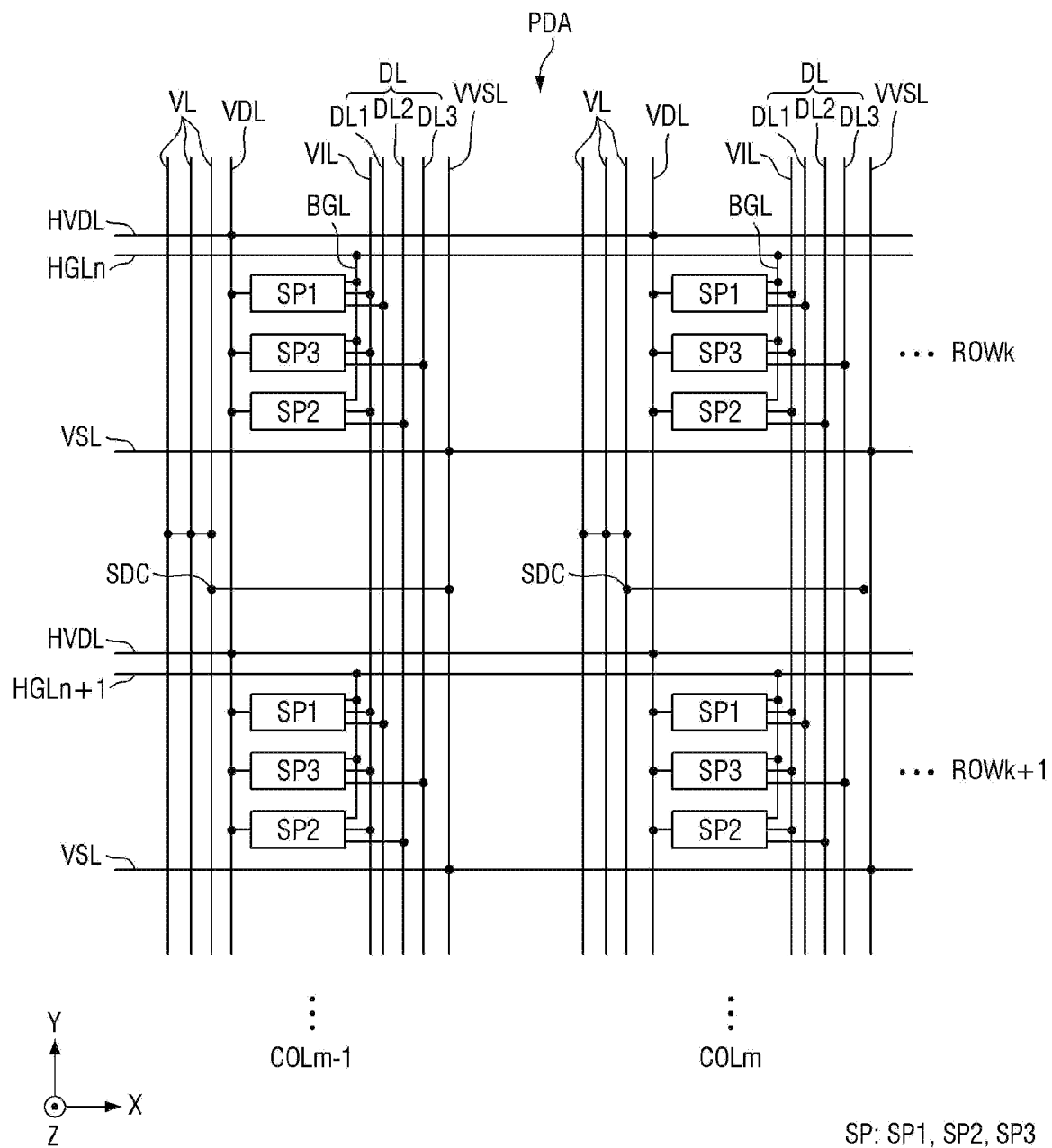
FIG. 7 is a view illustrating a pixel and lines of a power area in a display device according to one or more embodiments.

FIG. 7 is a view illustrating a pixel and lines of a power area in a display device according to one or more embodiments.

Referring to FIG. 7, the power area PDA may include a pixel SP, a power line VL, a horizontal gate line HGL, an auxiliary gate line BGL, a first voltage line VDL, a horizontal voltage line HVDL, an initialization voltage line VIL, a data line DL, and a vertical voltage line VVSL. The pixel SP may include first to third pixels SP1, SP2, and SP3. The pixel circuit of the first pixel SP1, the pixel circuit of the third pixel SP3, and the pixel circuit of the second pixel SP2 may be arranged in the opposite direction of the second direction (Y-axis direction), but the order of the pixel circuits is not limited thereto.

The plurality of power lines VL may extend in the second direction (Y-axis direction). The plurality of power lines VL may be located on the left side of the first voltage line VDL. The plurality of power lines VL may be located between the vertical voltage line VVSL and the first voltage line VDL. The power line VL may supply a driving voltage, a high potential voltage, a low potential voltage, or an off voltage to the power area PDA. Adjacent voltage lines VL may be electrically connected to each other. For example, the plurality of power lines VL may be located on the left side of the pixel SP located in an (m)th column COLm (m is an integer greater than or equal to 2). The plurality of power lines VL may be located in parallel between the data line DL connected to the pixel SP located in an (m−1)th column COLm−1 and the first voltage line VDL connected to the pixel SP located in the (m)th column COLm. The plurality of power lines VL may be located on the left side of the first voltage line VDL connected to the pixel SP located in the (m−1)th column COLm−1.

The horizontal gate line HGL may extend in the first direction (X-axis direction). The horizontal gate line HGL may be located above the pixel circuit of the first pixel SP1. The horizontal gate line HGL of the scan area SDA may be extended to the power area PDA. The horizontal gate line HGL of the power area PDA may supply the gate signal received from the vertical gate line VGL of the scan area SDA to the auxiliary gate line BGL. For example, the (n)th horizontal gate line HGLn may be located above the pixel circuit of the first pixel SP1 located in the (k)th row ROWk (k is a positive integer). The (n+1)th horizontal gate line HGLn+1 may be located above the pixel circuit of the first pixel SP1 located in the (k+1)th row ROWk+1.

The auxiliary gate line BGL may extend from the horizontal gate line HGL in the opposite direction of the second direction (Y-axis direction). The auxiliary gate line BGL may be located on the right side of the pixel circuit of each of the first to third pixels SP1, SP2, and SP3. The auxiliary gate line BGL may supply the gate signal received from the horizontal gate line HGL to the pixel circuit of each of the first to third pixels SP1, SP2, and SP3.

The first voltage line VDL may extend in the second direction (Y-axis direction). The first voltage line VDL may be located on the left side of the pixel circuit of each of the first to third pixels SP1, SP2, and SP3. The first voltage line VDL may supply the driving voltage or high potential voltage to each transistor of the first to third pixels SP1, SP2, and SP3.

The horizontal voltage line HVDL may extend in the first direction (X-axis direction). The horizontal voltage line HVDL may be located above the horizontal gate line HGL. For example, the horizontal voltage line HVDL may be located above the (n)th horizontal gate line HGLn or the (n+1)th horizontal gate line HGLn+1. The horizontal voltage line HVDL may be connected to the first voltage line VDL.

The horizontal voltage line HVDL may supply the driving voltage or high potential voltage to the first voltage line VDL.

The initialization voltage line VIL may extend in the second direction (Y-axis direction). The initialization voltage line VIL may be located on the right side of the auxiliary gate line BGL. The initialization voltage line VIL may be located between the auxiliary gate line BGL and the data line DL. The initialization voltage line VIL may supply an initialization voltage to the pixel circuit of each of the first to third pixels SP1, SP2, and SP3. The initialization voltage line VIL may receive the sensing signal from the pixel circuit of each of the first to third pixels SP1, SP2, and SP3, and may supply the sensing signal to the second display driver 222.

The plurality of data lines DL may extend in the second direction (Y-axis direction). The plurality of data lines DL may supply the data voltage to the first to third pixels SP1, SP2, and SP3. The plurality of data lines DL may include first to third data lines DL1, DL2, and DL3.

The first data line DL1 may extend in the second direction (Y-axis direction). The first data line DL1 may be located on a right side of the initialization voltage line VIL. The first data line DL1 may supply the data voltage received from the second display driver 222 to the pixel circuit of the first pixel SP1.

The second data line DL2 may extend in the second direction (Y-axis direction). The second data line DL2 may be located on the right side of the first data line DL1. The second data line DL2 may supply the data voltage received from the second display driver 222 to the pixel circuit of the second pixel SP2.

The third data line DL3 may extend in the second direction (Y-axis direction). The third data line DL3 may be located on the right side of the second data line DL2. The third data line DL3 may supply the data voltage received from the second display driver 222 to the pixel circuit of the third pixel SP3.

The vertical voltage line VVSL may extend in the second direction (Y-axis direction). The vertical voltage line VVSL may be located on the right side of the third data line DL3. The vertical voltage line VVSL may be connected between the power supply 250 and the second voltage line VSL. The vertical voltage line VVSL may supply the low potential voltage supplied from the power supply 250 to the second voltage line VSL.

The second voltage line VSL may extend in the first direction (X-axis direction). The second voltage line VSL may be located below the pixel circuit of the second pixel SP2. The second voltage line VSL may supply the low potential voltage received from the vertical voltage line VVSL to the light emitting element layer of each of the first to third pixels SP1, SP2, and SP3.

Figure 8:
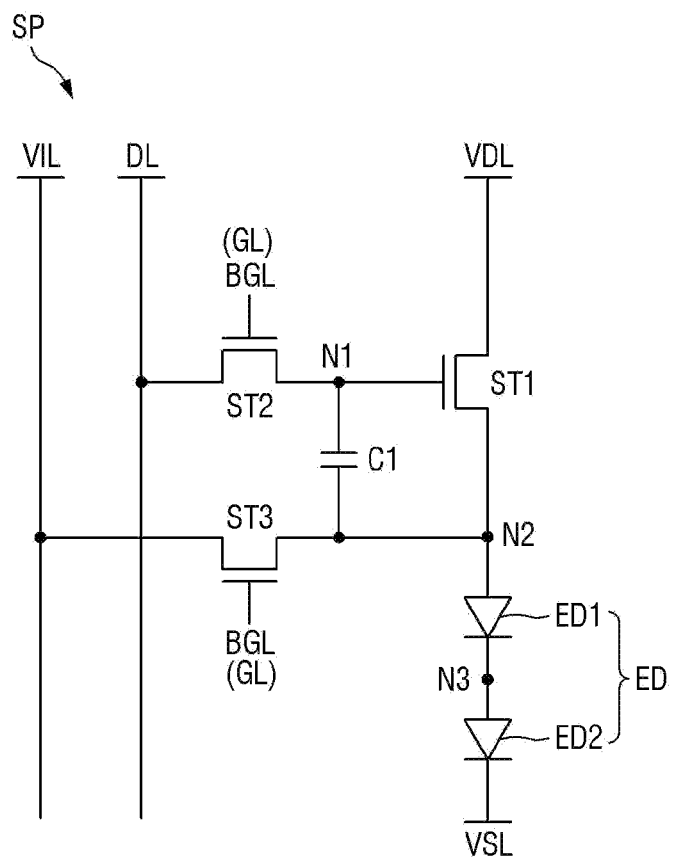
FIG. 8 is a circuit diagram illustrating a pixel of a display device according to one or more embodiments.

FIG. 8 is a circuit diagram illustrating a pixel of a display device according to one or more embodiments.

Referring to FIG. 8, the pixel SP may include first to third pixels SP1, SP2, and SP3. Each of the first to third pixels SP1, SP2, and SP3 may be connected to the first voltage line VDL, the data line DL, the initialization voltage line VIL, the auxiliary gate line BGL, and the second voltage line VSL.

Each of the first to third pixels SP1, SP2, and SP3 may include first to third transistors ST1, ST2, and ST3, a first capacitor C1, and a plurality of light emitting elements ED.

The first transistor ST1 may include a gate electrode, a drain electrode, and a source electrode. The gate electrode of the first transistor ST1 may be connected to a first node N1, its drain electrode may be connected to the first voltage line VDL, and its source electrode may be connected to a second node N2. The first transistor ST1 may control a drain-source current (or driving current) based on the data voltage applied to the gate electrode.

The plurality of light emitting elements ED may include a first light emitting element ED1 and a second light emitting element ED2. The first and second light emitting elements ED1 and ED2 may be connected in series. The first and second light emitting elements ED1 and ED2 may receive the driving current to emit light. The light emitting amount or luminance of the light emitting element ED may be proportional to a magnitude of the driving current. For example, the light emitting element ED may be an inorganic light emitting element that includes an inorganic semiconductor, but is not limited thereto. For another example, the light emitting element ED may be a quantum dot light emitting diode that includes a quantum dot light emitting layer, an organic light emitting diode that includes an organic light emitting layer, or a micro light emitting diode. The configuration of the light emitting element layer of the display device 10 may be designed and changed depending on the type of the light emitting element ED.

A first electrode of the first light emitting element ED1 may be connected to the second node N2, and its second electrode may be connected to a third node N3. The first electrode of the first light emitting element ED1 may be connected to the source electrode of the first transistor ST1, a drain electrode of the third transistor ST3, and a second capacitor electrode of the first capacitor C1 through the second node N2. The second electrode of the first light emitting element ED1 may be connected to a first electrode of the second light emitting element ED2 through the third node N3.

The first electrode of the second light emitting element ED2 may be connected to the third node N3, and its second electrode may be connected to the second voltage line VSL. The first electrode of the second light emitting element ED2 may be connected to the second electrode of the first light emitting element ED1 through the third node N3.

The second transistor ST2 may be turned on by the gate signal of the auxiliary gate line BGL or of the gate line GL to electrically connect the data line DL with the first node N1 that is the gate electrode of the first transistor ST1. The second transistor ST2 may be turned on based on the gate signal to supply the data voltage to the first node N1. A gate electrode of the second transistor ST2 may be connected to the auxiliary gate line BGL, its drain electrode may be connected to the data line DL, and its source electrode may be connected to the first node N1. The source electrode of the second transistor ST2 may be connected to the gate electrode of the first transistor ST1 and a first capacitor electrode of the first capacitor C1 through the first node N1.

The third transistor ST3 may be turned on by the gate signal of the auxiliary gate line BGL or of the gate line GL to electrically connect the initialization voltage line VIL with the second node N2 that is the source electrode of the first transistor ST1. The third transistor ST3 may be turned on based on the gate signal to supply an initialization voltage to the second node N2. A gate electrode of the third transistor ST3 may be connected to the auxiliary gate line BGL, its drain electrode may be connected to the second node N2, and its source electrode may be connected to the initialization voltage line VIL. The drain electrode of the third transistor ST3 may be connected to the source electrode of the first transistor ST1, the second capacitor electrode of the first capacitor C1, and the first electrode of the first light emitting element ED1 through the second node N2.

Figure 9:
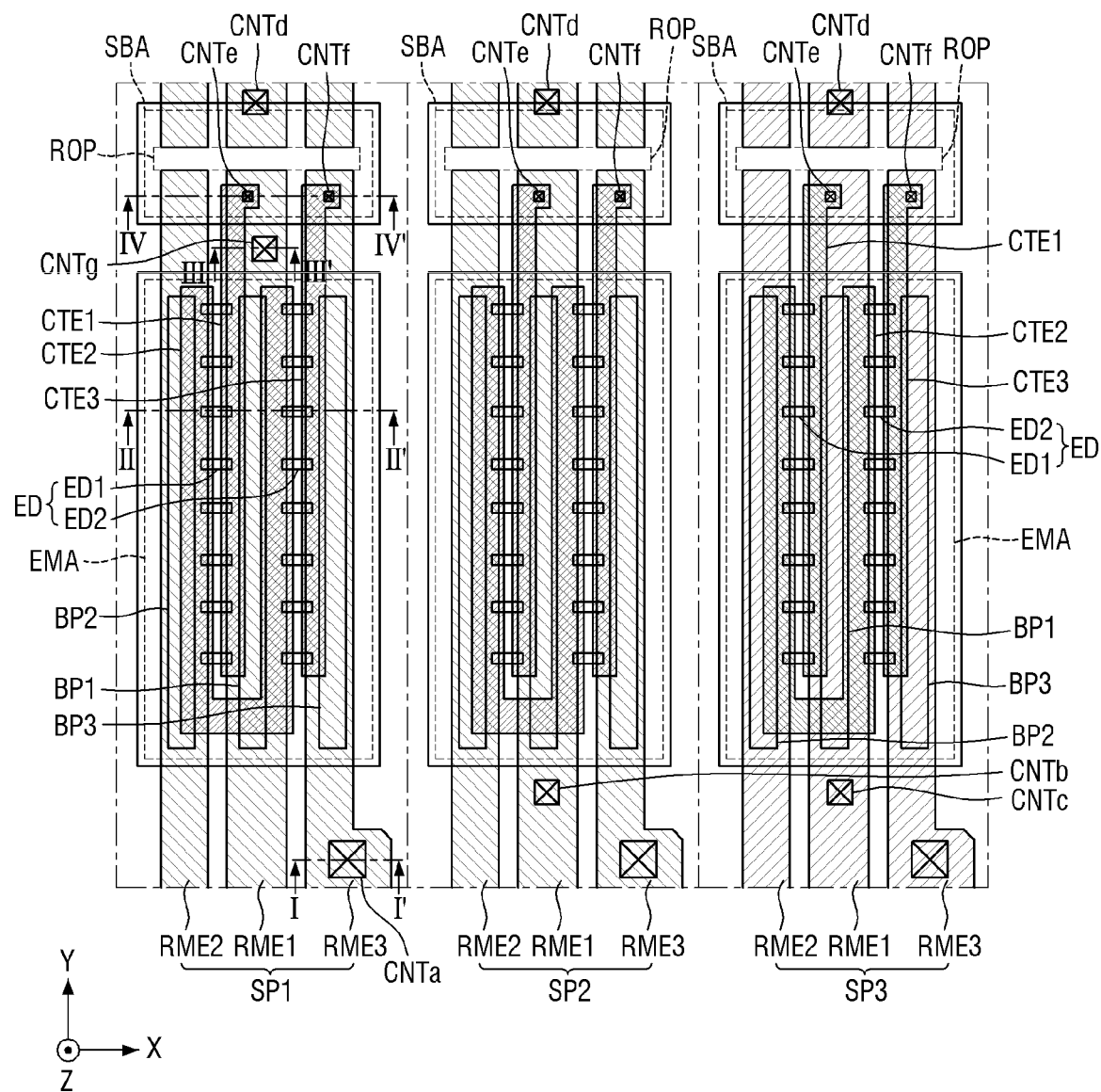
FIG. 9 is a plan view illustrating a light emitting element layer of a display device according to one or more embodiments.
Figure 10:
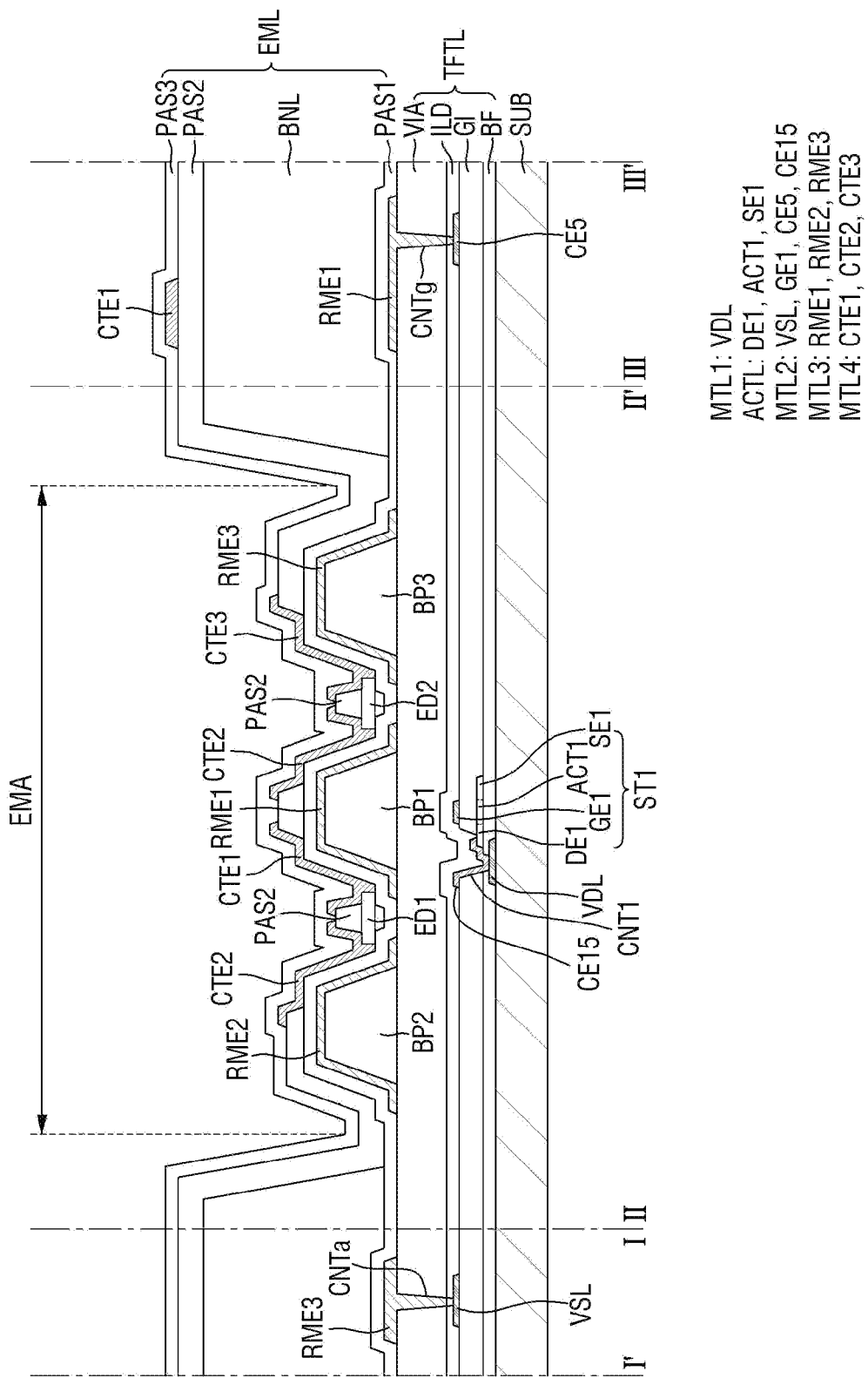
FIG. 10 is a cross-sectional view taken along the lines I-I', II-II', and III-III' of FIG. 9.
Figure 11:
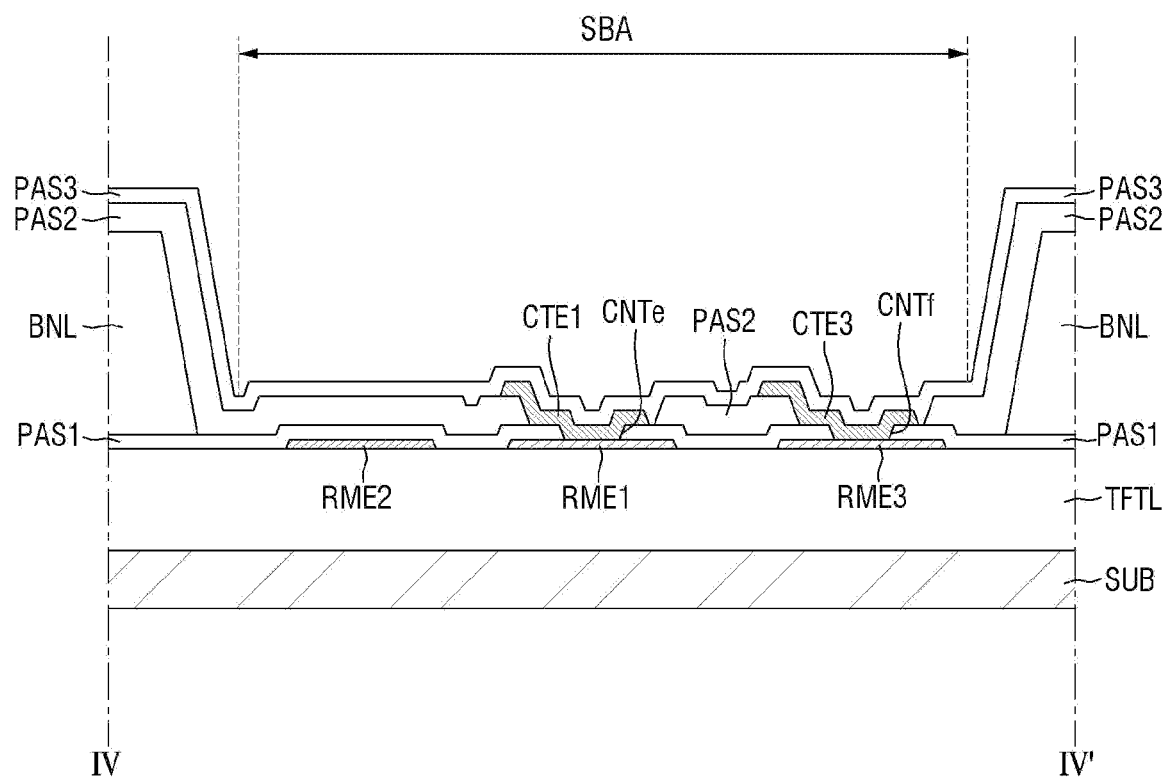
FIG. 11 is a cross-sectional view taken along the line IV-IV' of FIG. 9.

FIG. 9 is a plan view illustrating a light emitting element layer of a display device according to one or more embodiments. FIG. 10 is a cross-sectional view taken along the lines I-I', II-II', and III-III' of FIG. 9. FIG. 11 is a cross-sectional view taken along the line IV-IV' of FIG. 9.

Referring to FIGS. 9 to 11, the display device according to one or more embodiments may include a substrate SUB, a thin film transistor layer TFTL layer on the substrate SUB, and a light emitting element layer EML on the thin film transistor layer TFTL. The thin film transistor layer TFTL may include a first metal layer MTL1 on the substrate SUB, a buffer layer BF on the first metal layer MTL1, an active layer ACTL on the buffer layer BF, a gate insulating layer GI on the active layer ACTL, a second metal layer MTL2 on the gate insulating layer GI, an interlayer dielectric layer ILD on the second metal layer MTL2, and a via layer VIA on the interlayer dielectric layer ILD.

The light emitting element layer EML may be located on the thin film transistor layer TFTL. The light emitting element layer EML may include first to third bank patterns BP1, BP2, and BP3, first to third electrodes RME1, RME2, and RME3, first and second light emitting elements ED1 and ED2, a first insulating layer PAS1, a bank layer BNL, a second insulating layer PAS2, first to third contact electrodes CTE1, CTE2, and CTE3, and a third insulating layer PAS3.

The first bank pattern BP1 may be located at the center of a light emission area EMA, the second bank pattern BP2 may be located on a left side of the light emission area EMA, and the third bank pattern BP3 may be located on a right side of the light emission area EMA. Each of the first to third bank patterns BP1, BP2, and BP3 may protrude in an upper direction (Z-axis direction) on the via layer. Each of the first to third bank patterns BP1, BP2, and BP3 may have an inclined side. The plurality of first light emitting elements ED1 may be located between the first and second bank patterns BP1 and BP2, and the plurality of second light emitting elements ED2 may be located between the second and third bank patterns BP2 and BP3. The first to third bank patterns BP1, BP2, and BP3 may have the same length in the second direction (Y-axis direction), and their lengths in the first direction (X-axis direction) may be different from one another, but are not limited thereto. The first to third bank patterns BP1, BP2, and BP3 may be located on a front surface of the display area DA in an island pattern.

First to third electrodes RME1, RME2, and RME3 of the first to third pixels SP1, SP2, and SP3 may correspond to a third metal layer MTL3. The third metal layer MTL3 may be located on the via layer VIA and the first to third bank patterns BP1, BP2, and BP3. The first electrode RME1 may extend in the second direction (Y-axis direction) at the center of the light emission area EMA. The first electrode RME1 may cover an upper surface of, and the inclined side of, the first bank pattern BP1. Therefore, the first electrode RME1 may reflect light emitted from the first and second light emitting elements ED1 and ED2 in the upper direction (Z-axis direction).

The second electrode RME2 may extend from the left side of the light emission area EMA in the second direction (Y-axis direction). The second electrode RME2 may cover an upper surface of, and the inclined side of, the second bank pattern BP2. Therefore, the second electrode RME2 may reflect the light emitted from the first light emitting element ED1 in the upper direction (Z-axis direction).

The third electrode RME3 may extend from the right side of the light emission area EMA in the second direction (Y-axis direction). The third electrode RME3 may cover an upper surface of, and the inclined side of, the third bank pattern BP3. Therefore, the third electrode RME3 may reflect the light emitted from the second light emitting element ED2 in the upper direction (Z-axis direction).

One end of each of the first to third electrodes RME1, RME2, and RME3 may be partitioned in a row unit by a partition portion ROP. The first to third electrodes RME1, RME2, and RME3 may be alignment electrodes that align the first and second light emitting elements ED1 and ED2 during the manufacturing process of the display device 10. Before being partitioned, the first electrode RME1 may be connected to a horizontal voltage line HVDL of the second metal layer MTL2 through a contact hole CNTd, and may receive a driving voltage or high potential voltage to serve as the alignment electrode. Therefore, the first to third electrodes RME1, RME2, and RME3 may be partitioned by the partition portion ROP after the alignment process of the plurality of light emitting elements ED is completed.

The first electrode RME1 of the first pixel SP1 may be connected to a fifth connection electrode CE5 of the second metal layer MTL2 through a contact hole CNTg. The first electrode RME1 may receive a driving current, which has passed through the first transistor ST1, from the fifth connection electrode CE5. The first electrode RME1 may supply the driving current to the plurality of first light emitting elements ED1 of the first pixel SP1 through the first contact electrode CTE1.

The third electrode RME3 of the first pixel SP1 may be connected to a second voltage line VSL of the second metal layer MTL2 through a contact hole CNTa. Therefore, the third electrode RME3 of the first pixel SP1 may receive a low potential voltage from the second voltage line VSL.

The first electrode RME1 of the second pixel SP2 may be connected to a tenth connection electrode of the second metal layer MTL2 through a contact hole CNTb. The first electrode RME1 may receive the driving current, which has passed through the first transistor ST1, from the tenth connection electrode. The first electrode RME1 may supply the driving current to the plurality of first light emitting elements ED1 of the second pixel SP2 through the first contact electrode CTE1.

The third electrode RME3 of the second pixel SP2 may be connected to the second voltage line VSL of the second metal layer MTL2 through the contact hole CNTa. Therefore, the third electrode RME3 of the second pixel SP2 may receive the low potential voltage from the second voltage line VSL.

The first electrode RME1 of the third pixel SP3 may be connected to a fourteenth connection electrode of the second metal layer MTL2 through the contact hole CNTb. The first electrode RME1 may receive the driving current, which has passed through the first transistor ST1, from the fourteenth connection electrode. The first electrode RME1 may supply the driving current to the plurality of first light emitting elements ED1 of the third pixel SP3 through the first contact electrode CTE1.

The third electrode RME3 of the third pixel SP3 may be connected to the second voltage line VSL of the second metal layer MTL2 through the contact hole CNTa. Therefore, the third electrode RME3 of the third pixel SP3 may receive the low potential voltage from the second voltage line VSL.

The plurality of first light emitting elements ED1 may be aligned between the first electrode RME1 and the second electrode RME2. The first insulating layer PAS1 may cover the first to third electrodes RME1, RME2, and RME3. The first light emitting element ED1 may be insulated from the first and second electrodes RME1 and RME2 by the first insulating layer PAS1. Before the first and second electrodes RME1 and RME2 are cut by the partition portion ROP, each of the first and second electrodes RME1 and RME2 may receive an alignment signal, and an electric field may be formed between the first and second electrodes RME1 and RME2. For example, the plurality of first light emitting elements ED1 may be sprayed onto the first and second electrodes RME1 and RME2 through an inkjet printing process, and the plurality of first light emitting elements ED1 dispersed in the ink may be aligned by a dielectrophoresis force received by the electric field formed between the first and second electrodes RME1 and RME2. Therefore, the plurality of first light emitting elements ED1 may be aligned between the first and second electrodes RME1 and RME2 along the second direction (Y-axis direction).

The plurality of second light emitting elements ED2 may be aligned between the first electrode RME1 and the third electrode RME3. The second light emitting element ED2 may be insulated from the first and third electrodes RME1 and RME3 by the first insulating layer PAS1. Before the first and third electrodes RME1 and RME3 are cut by the partition portion ROP, each of the first and third electrodes RME1 and RME3 may receive an alignment signal, and an electric field may be formed between the first and third electrodes RME1 and RME3. For example, the plurality of second light emitting elements ED2 may be sprayed onto the first and third electrodes RME1 and RME3 through the inkjet printing process, and the plurality of second light emitting elements ED2 dispersed in the ink may be aligned by a dielectrophoresis force received by the electric field formed between the first and third electrodes RME1 and RME3. Therefore, the plurality of second light emitting elements ED2 may be aligned between the first and third electrodes RME1 and RME3 along the second direction (Y-axis direction).

The first to third contact electrodes CTE1, CTE2, and CTE3 of the first to third pixels SP1, SP2, and SP3 may be located on the first to third electrodes RME1, RME2, and RME3, respectively, noting that the second contact electrode CTE2 may be located on both the first and second electrodes RME1 and RME2. The second insulating layer PAS2 may be located on the bank layer BNL, the first insulating layer PAS1, and a central portion of the light emitting element ED. The third insulating layer PAS3 may cover the second insulating layer PAS2 and the first to third contact electrodes CTE1, CTE2, and CTE3. The second and third insulating layers PAS2 and PAS3 may insulate the first to third contact electrodes CTE1, CTE2, and CTE3 from one another.

The first contact electrode CTE1 may be located on the first electrode RME1, and may be connected to the first electrode RME1 through a contact hole CNTe. The first contact electrode CTE1 may be connected between the first electrode RME1 and one end of each of the plurality of first light emitting elements ED1. The first contact electrode CTE1 may correspond to an anode electrode of the plurality of first light emitting elements ED1, but is not limited thereto.

The second contact electrode CTE2 may be located on the first and second electrodes RME1 and RME2, and may be insulated from the first and second electrodes RME1 and RME2. A first portion of the second contact electrode CTE2 may be located on the second electrode RME2, and may extend in the second direction (Y-axis direction). A second portion of the second contact electrode CTE2 may be bent from a lower side of the first portion, and may extend in the first direction (X-axis direction). A third portion of the second contact electrode CTE2 may be bent from a right side of the second portion and extended in the second direction (Y-axis direction), and may be located on the first electrode RME1.

The second contact electrode CTE2 may be connected between the other end of each of the plurality of first light emitting elements ED1 and one end of each of the plurality of second light emitting elements ED2. The second contact electrode CTE2 may correspond to the third node N3 of FIG. 8. The second contact electrode CTE2 may correspond to a cathode electrode of the plurality of first light emitting elements ED1, but is not limited thereto. The second contact electrode CTE2 may correspond to an anode electrode of the plurality of second light emitting elements ED2, but is not limited thereto.

The third contact electrode CTE3 may be located on the third electrode RME3, and may be connected to the third electrode RME3 through a twenty-ninth (29th) contact hole CNT29. The third contact electrode CTE3 may be connected between the other end of each of the plurality of second light emitting elements ED2 and the third electrode RME3. The third contact electrode CTE3 may correspond to the cathode electrode of the plurality of second light emitting elements ED2, but is not limited thereto. The third contact electrode CTE3 may receive the low potential voltage through the third electrode RME3.

The first transistor ST1 of the thin film transistor layer TFTL may include an active area ACT1, a gate electrode GE1, a drain electrode DE1, and a source electrode SE1. The drain electrode DE1 of the first transistor ST1 may receive the driving voltage from the first voltage line VDL of the first metal layer MTL1 through a fifteenth connection electrode CE15.

Hereinafter, the second pad PD2 of the display device 10 according to one or more embodiments will be described in detail together with a method of manufacturing the display device 10.

Figure 12:
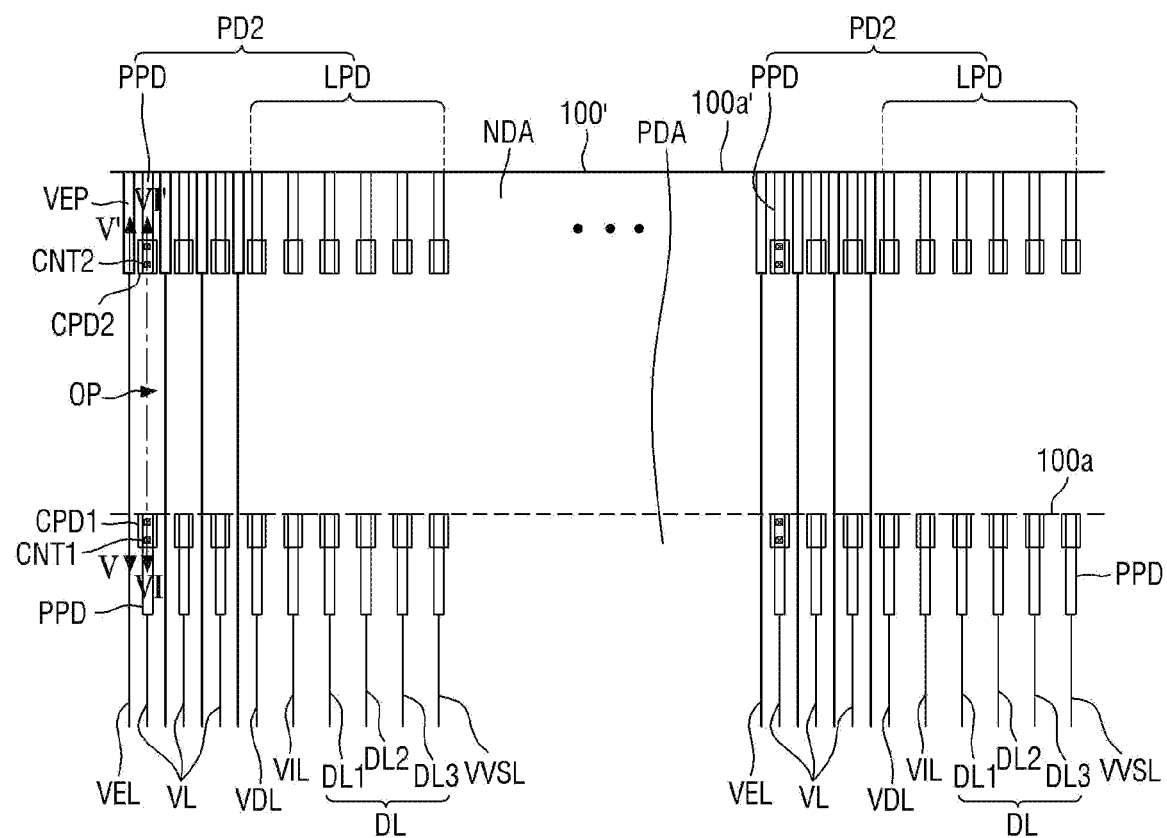
FIG. 12 is a plan view illustrating a process operation of a method of manufacturing a display device according to one or more embodiments.
Figure 13:
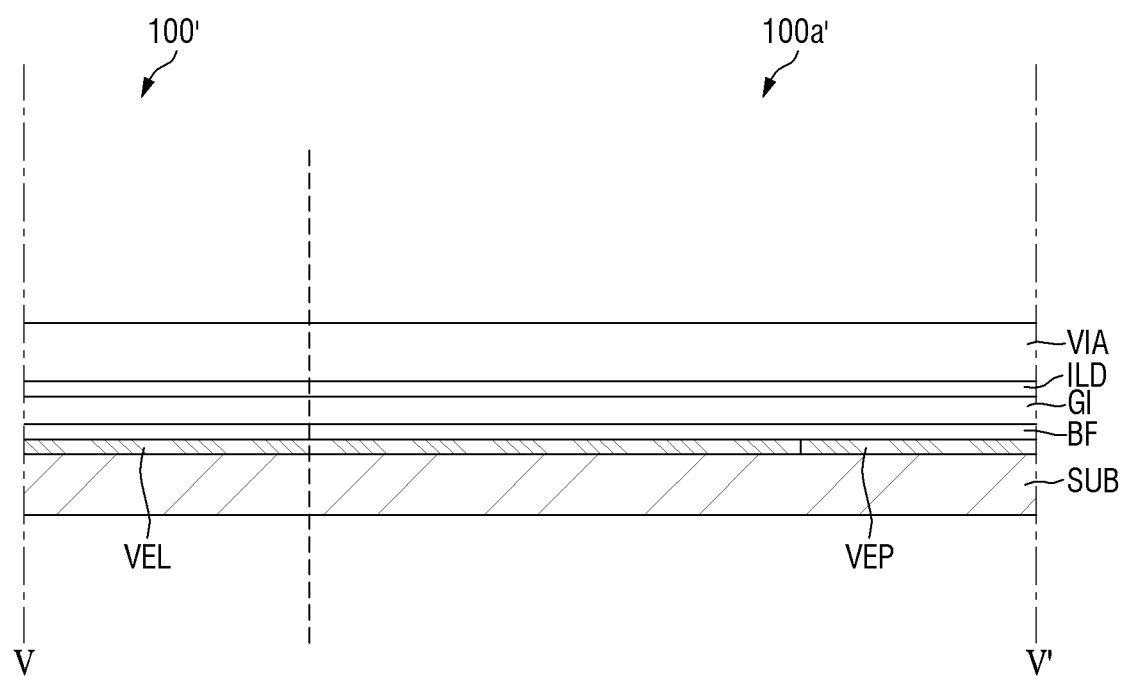
FIG. 13 is a cross-sectional view taken along the line V-V' of FIG. 12.
Figure 14:
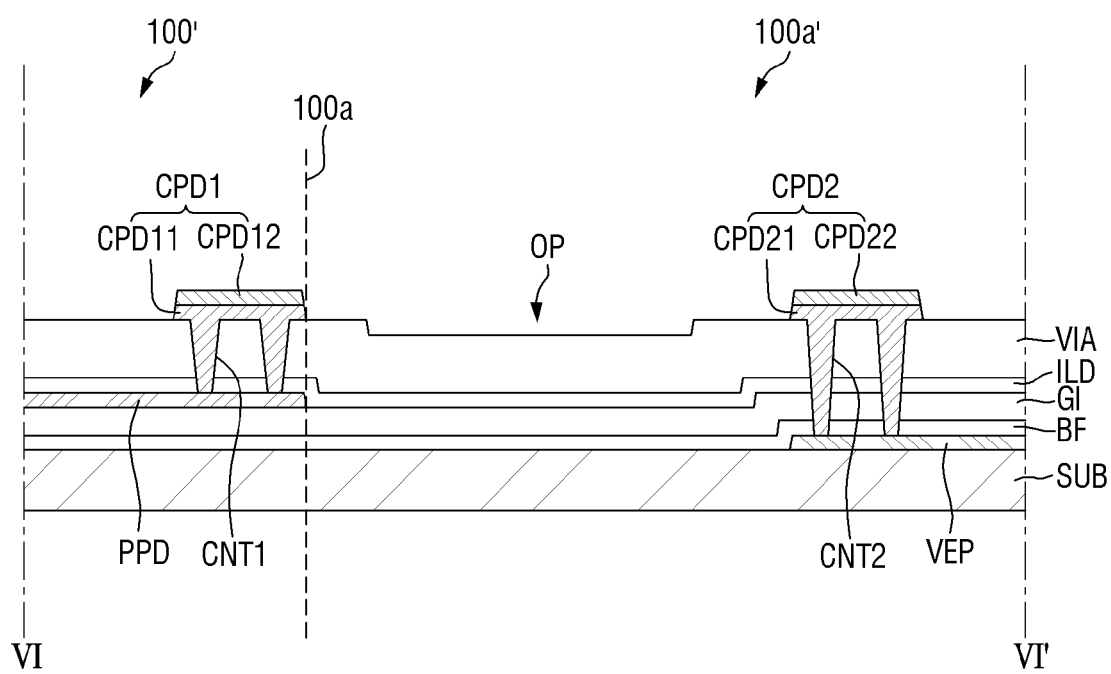
FIG. 14 is a cross-sectional view taken along the line VI-VI' of FIG. 12.

FIG. 12 is a plan view illustrating a process operation of a method of manufacturing a display device according to one or more embodiments. FIG. 13 is a cross-sectional view taken along the line V-V' of FIG. 12. FIG. 14 is a cross-sectional view taken along the line VI-VI' of FIG. 12.

Referring to FIGS. 12 to 14, the method of manufacturing a display device according to one or more embodiments may include the operation of preparing a target panel 100' that includes a display area DA having a scan area SDA and having a power area PDA located on one side of the scan area SDA, a non-display area NDA having pad portions PD1 and PD2 surrounding the display area DA, located on one side thereof, and an outer area located outside the non-display area NDA, having a lighting-test pad portion VEP, and the operation of cutting the outer area of the target panel 100'.

In the operation of preparing the target panel 100' that includes a display area DA having a scan area SDA and having a power area PDA located on one side of the scan area SDA, a non-display area NDA having pad portions PD1 and PD2 surrounding the display area DA, located on one side thereof, and an outer area located outside the non-display area NDA, having a lighting-test pad portion VEP, the pad portions PD1 and PD2 may include a first pad PD1 connected to lines of the scan area SDA, including a plurality of line pads LPD respectively extended along the second direction (Y direction), and a second pad PD2 including a plurality of line pads LPD connected to lines of the power area PDA and respectively extending along the second direction (Y direction), and also including a power pad PPD connected to the lines of the power area PDA and extending along the second direction (Y direction).

The power pad PPD may supply an off signal to the power area PDA through the power line VL. The lighting-test pad portion VEP may extend along the second direction (Y-direction), and the lighting-test pad portion VEP and the power pad PPD may be positioned on the same line in the second direction (Y-direction). That is, the lighting-test pad portion VEP and the power pad PPD may overlap each other in the second direction (Y direction).

In the operation of preparing the target panel 100' that includes a display area DA having a scan area SDA and having a power area PDA located on one side of the scan area SDA, that includes a non-display area NDA having pad portions PD1 and PD2 surrounding the display area DA, located on one side thereof, and that includes an outer area located outside the non-display area NDA, having a lighting-test pad portion VEP, and having a panel-lighting-test line VEL extended from the outer area to the second pad PD2 along the second direction (Y-direction) may be further provided.

The power pad PPD and the panel-lighting-test line VEL may be provided in a plural number, and at least one of the plurality of panel-lighting-test lines VEL may be located between adjacent power pads PPD.

As shown in FIG. 12, a side 100a' of the target panel 100' may be located outside the side 100a of the display panel 100. An area of the target panel 100', which is protruded outwardly from the side 100a of the display panel 100, may be defined as the above-described outer area. A plurality of panel-lighting-test pad portions VEP may be in the outer area. The plurality of panel-lighting-test pad portions VEP may be arranged along the first direction (X-axis direction). A portion of the plurality of panel-lighting-test pad portions VEP may be connected to the panel-lighting-test line VEL, and another portion of the plurality of panel-lighting-test pad portions VEP may not be connected to the panel-lighting-test line VEL. The panel-lighting-test pad portions VEP that are not connected to the panel-lighting-test line VEL may be positioned on the same line as the power pad PPD in the second direction (Y-axis direction). The panel-lighting-test pad portion VEP, which is not connected to the panel-lighting-test line VEL, and the power pad PPD may be separated in the second direction (Y-axis direction) based on an open portion OP shown in FIG. 12. Connection electrodes CPD1 and CPD2 may be further located on the panel-lighting-test pad portion VEP, which is not connected to the panel-lighting-test line VEL, and the power pad PPD, respectively. The first connection electrode CPD1 may be located on the power pad PPD, and the second connection electrode CPD2 may be located on the panel-lighting-test pad portion VEP that is not connected to the panel-lighting-test line VEL. Also, the second connection electrode CPD2 may be located on the power pad PPD. The first connection electrode CPD1 may overlap the power pad PPD, and the second connection electrode CPD2 may overlap the panel-lighting-test pad portion VEP that is not connected to the panel-lighting-test line VEL.

The panel-lighting-test line VEL and the panel-lighting-test pad portion VEP may correspond to the first metal layer MTL1 of FIG. 10. The power pad PPD may correspond to the second metal layer MTL2 of FIG. 10.

As shown in FIG. 14, the first connection electrode CPD1 may include a first lower connection electrode CPD11 on the via layer VIA, and a first upper connection electrode CPD12 on the first lower connection electrode CPD11, and the second connection electrode CPD2 may include a second lower connection electrode CPD21 on the via layer VIA, and a second upper connection electrode CPD22 on the second lower connection electrode CPD21. The first upper connection electrode CPD12 may be located directly on the first lower connection electrode CPD11, and the second upper connection electrode CPD22 may be located directly on the second lower connection electrode CPD21. The first lower connection electrode CPD11 may be connected to the power pad PPD through a contact hole CNT1 that passes through the via layer VIA and the interlayer dielectric layer ILD, and the second lower connection electrode CPD21 may be connected to the panel-lighting-test pad portion VEP through a contact hole CNT2 that passes through the via layer VIA and the interlayer dielectric layer ILD. The lower connection electrodes CPD11 and CPD21 may be located in a fifth metal layer located between the via layer VIA and the third metal layer MTL3, and the upper connection electrodes CPD21 and CPD22 may correspond to the third metal layer MTL3, respectively.

Figure 15:
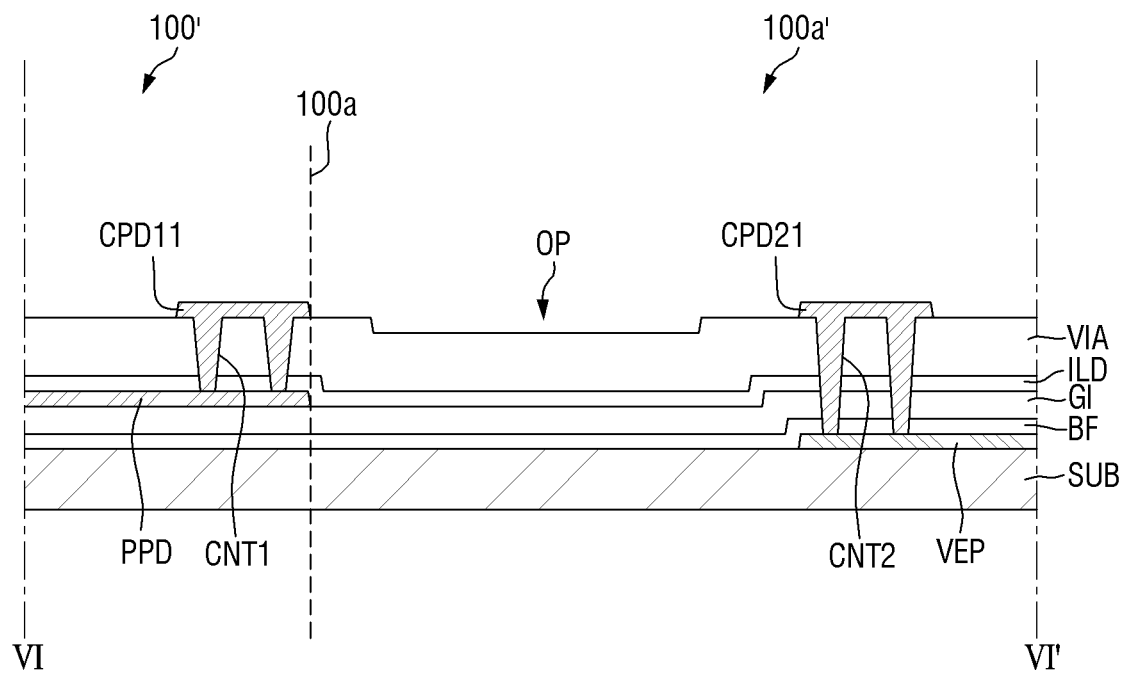
FIG. 15 is a plan view illustrating a process operation of a method of manufacturing a display device according to one or more other embodiments.

FIG. 15 is a plan view illustrating a process operation of a method of manufacturing a display device according to one or more other embodiments.

Referring to FIG. 15, the method of manufacturing a display device according to one or more embodiments is different from the one or more embodiments corresponding to FIG. 14 in that the upper connection electrodes CPD12 and CPD22 may be omitted in the operation of preparing the target panel 100' that includes a display area DA having a scan area SDA and having a power area PDA located on one side of the scan area SDA, that includes a non-display area NDA having pad portions PD1 and PD2 surrounding the display area DA and located on one side thereof, and that includes an outer area located outside the non-display area NDA and having a lighting-test pad portion VEP.

Because the other description has been made with reference to FIG. 14, a detailed description will be omitted below.

Figure 16:
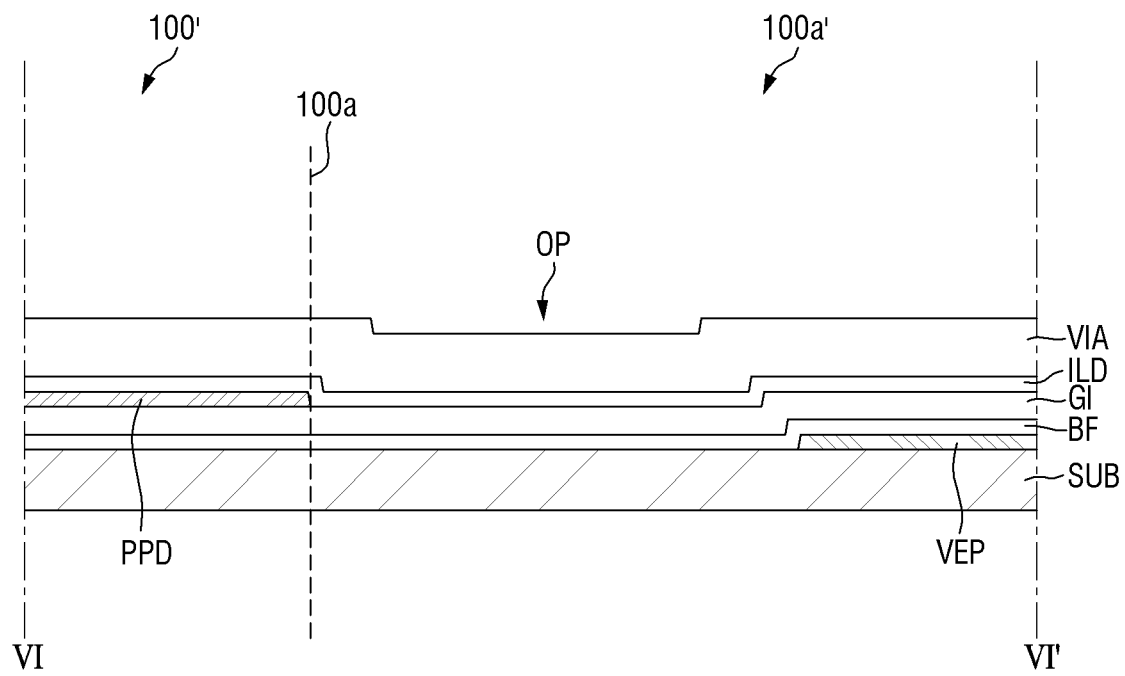
FIG. 16 is a plan view illustrating a process operation of a method of manufacturing a display device according to still one or more other embodiments.

FIG. 16 is a plan view illustrating a process operation of a method of manufacturing a display device according to still one or more other embodiments.

Referring to FIG. 16, the method of manufacturing a display device according to one or more embodiments is different from the one or more embodiments corresponding to FIG. 14 in that the connection electrodes CPD1 and CPD2 may be omitted in the operation of preparing the target panel 100' that includes a display area DA having a scan area SDA and having a power area PDA located on one side of the scan area SDA, than includes a non-display area NDA having pad portions PD1 and PD2 surrounding the display area DA and located on one side thereof, and that includes an outer area located outside the non-display area NDA and having a lighting-test pad portion VEP.

Because the other description has been made with reference to FIG. 14, a detailed description will be omitted below.

Figure 17:
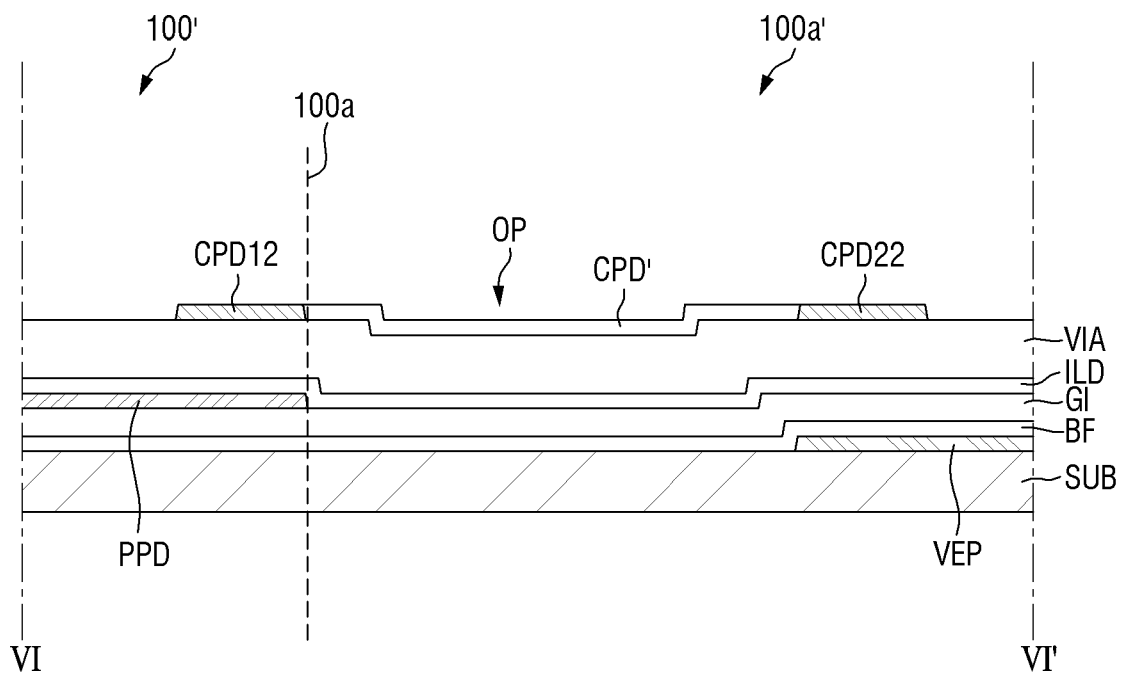
FIG. 17 is a plan view illustrating a process operation of a method of manufacturing a display device according to further still one or more other embodiments.

FIG. 17 is a plan view illustrating a process operation of a method of manufacturing a display device according to further still one or more other embodiments.

Referring to FIG. 17, the method of manufacturing a display device according to one or more embodiments is different from the one or more embodiments corresponding to FIG. 14 in that the lower connection electrodes CPD11 and CPD21 of the connection electrodes CPD1 and CPD2 and the contact holes CNT1 and CNT2 may be omitted in the operation of preparing the target panel 100' that includes a display area DA having a scan area SDA and having a power area PDA located on one side of the scan area SDA, that includes a non-display area NDA having pad portions PD1 and PD2 surrounding the display area DA and located on one side thereof, and that includes an outer area located outside the non-display area NDA and having a lighting-test pad portion VEP. Moreover, an auxiliary connection electrode CPD' for connecting the upper connection electrodes CPD12 and CPD22 may be further located in the open portion OP. In one or more embodiments, as the lower connection electrodes CPD11 and CPD21 and the contact holes CNT1 and CNT2 are omitted, electrical insulation may be made between the panel-lighting-test pad portion VEP and the power pad PPD.

Because the other description has been made with reference to FIG. 14, a detailed description will be omitted below.

However, the aspects of embodiments of the present disclosure are not restricted to the one set forth herein. The above and other aspects of the present disclosure will become more apparent to one of daily skill in the art to which the present disclosure pertains by referencing the claims, with functional equivalents thereof to be included therein.

What is claimed is:

1. A display device comprising:
   a display panel comprising:
      a display area having a scan area, and having a power area on one side of the scan area; and
      a non-display area surrounding the display area, and having a pad portion on one side of the non-display area, the pad portion comprising:
         a first pad comprising line pads connected to lines of the scan area;
         a second pad comprising line pads, and a power pad configured to supply an off signal to a line of the lines of the power area and connected to lines of the power area; and
         a panel-lighting-test line on at least one side of the power pad, and spaced apart from the power pad.

2. The display device of claim 1, wherein the panel-lighting-test line and the line of the power area extend in a same direction.

3. The display device of claim 1, wherein the second pad further comprises a first connection electrode that overlaps the power pad.

4. The display device of claim 3, wherein the first connection electrode comprises a first lower connection electrode.

5. The display device of claim 4, further comprising:
   a substrate;
   a first conductive layer on the substrate, and comprising the panel-lighting-test line;
   a second conductive layer on the first conductive layer, and comprising the power pads; and
   a third conductive layer on the second conductive layer, and comprising the first lower connection electrode.

6. The display device of claim 5, wherein the first connection electrode further comprises a first upper connection electrode on the first lower connection electrode.

7. The display device of claim 6, wherein the first upper connection electrode is directly on the first lower connection electrode, and comprises a fourth conductive layer on the third conductive layer and comprising the first upper connection electrode.

8. The display device of claim 7, further comprising:
   an interlayer dielectric layer between the second conductive layer and the third conductive layer; and
   a via layer between the interlayer dielectric layer and the third conductive layer,
   wherein the first lower connection electrode is connected to the power pad through a contact hole passing through the via layer and the interlayer dielectric layer.

9. The display device of claim 7, wherein the first connection electrode and the power pad are connected to each other.

10. The display device of claim 3, wherein the first connection electrode and the power pad are connected to each other.

11. A display device comprising:
    a display panel comprising:
       a display area having a scan area, and having a power area on one side of the scan area; and
       a non-display area surrounding the display area, and having a pad portion on one side thereof and comprising:
          a first pad comprising line pads connected to lines of the scan area; and
          a second pad comprising line pads, and a power pad connected to lines of the power area and configured to supply an off signal to a line of the lines of the power area,
    wherein any one of the line pads of the first pad or any one of the line pads of the second pad is connected to a vertical voltage line that is electrically connected to the line of the power area.

12. The display device of claim 11, wherein the power pad is provided in plural, and
    wherein the display device further comprises a panel-lighting-test line between adjacent ones of the power pads.

13. The display device of claim 11, wherein the second pad further comprises a first connection electrode that overlaps the power pad and that comprises a first lower connection electrode.

14. The display device of claim 13, further comprising:
    a substrate;
    a first conductive layer on the substrate, and comprising a panel-lighting-test line;
    a second conductive layer on the first conductive layer, and comprising the power pad; and
    a third conductive layer on the second conductive layer, and comprising the first lower connection electrode, which further comprises a first upper connection electrode directly on the first lower connection electrode.

* * * * *